US011928996B2

(12) United States Patent
Chen et al.

(10) Patent No.: US 11,928,996 B2
(45) Date of Patent: Mar. 12, 2024

(54) DISPLAY APPARATUS, DRIVE CHIP, AND ELECTRONIC DEVICE

(71) Applicant: Honor Device Co., Ltd., Guangdong (CN)

(72) Inventors: Pengming Chen, Shenzhen (CN); Jide Liang, Shenzhen (CN); Ruiliang Li, Shenzhen (CN); Feng Zhang, Shenzhen (CN); Jiandong Deng, Shenzhen (CN); Muyao Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 135 days.

(21) Appl. No.: 17/793,520

(22) PCT Filed: Sep. 22, 2021

(86) PCT No.: PCT/CN2021/119662
§ 371 (c)(1),
(2) Date: Jul. 18, 2022

(87) PCT Pub. No.: WO2022/068655
PCT Pub. Date: Apr. 7, 2022

(65) Prior Publication Data
US 2023/0119866 A1    Apr. 20, 2023

(30) Foreign Application Priority Data
Sep. 30, 2020  (CN) .......................... 202011066174.X

(51) Int. Cl.
*G09G 3/36* (2006.01)
*G09G 3/00* (2006.01)
(Continued)

(52) U.S. Cl.
CPC .............. *G09G 3/006* (2013.01); *G09G 3/20* (2013.01); *G11C 19/28* (2013.01);
(Continued)

(58) Field of Classification Search
CPC .................... G09G 3/006; G09G 3/20; G09G 2310/0286; G09G 2310/08; G09G 2330/08; G09G 2330/12; G11C 19/28
See application file for complete search history.

(56) References Cited

U.S. PATENT DOCUMENTS 6,816,143 B1 * 11/2004 Lambert .............. G09G 3/3688
345/99
8,144,304 B2    3/2012 Lin et al.
(Continued)

FOREIGN PATENT DOCUMENTS

CN        1797141 A    7/2006
CN      102879964 A    1/2013
(Continued)

*Primary Examiner* — Lin Li
(74) *Attorney, Agent, or Firm* — Leydig, Voit & Mayer, Ltd.

(57) ABSTRACT

Disclosed are a display apparatus, a drive chip, and an electronic device. When determining that a disconnected signal line (DL) exists, a drive chip sends a control signal to a signal line repair module, so that shift output ends (OUT) of a plurality of shift units sequentially output enable signals, and the shift unit corresponding to a connection switch electrically connected to the disconnected signal line (DL) continuously outputs enable signals, so that the connection switch electrically connected to the disconnected signal line (DL) is continuously turned on. The display apparatus may repair a disconnected signal line without being returned to a factory and a manual operation.

18 Claims, 13 Drawing Sheets

(51) Int. Cl.
*G09G 3/20* (2006.01)
*G09G 5/00* (2006.01)
*G11C 19/28* (2006.01)

(52) U.S. Cl.
CPC .............. *G09G 2310/0286* (2013.01); *G09G 2310/08* (2013.01); *G09G 2330/08* (2013.01); *G09G 2330/12* (2013.01)

(56) References Cited

U.S. PATENT DOCUMENTS

| | | | |
|---|---|---|---|
| 10,002,917 | B2 | 6/2018 | Xu et al. |
| 11,361,720 | B2 | 6/2022 | Miyawaki |
| 2007/0063951 | A1* | 3/2007 | Lin ...................... G09G 3/3611 345/93 |
| 2007/0109235 | A1 | 5/2007 | Hsu et al. |
| 2013/0147773 | A1 | 6/2013 | Jin et al. |
| 2014/0028654 | A1* | 1/2014 | Saitoh ...................... G09G 5/00 345/212 |
| 2015/0235582 | A1 | 8/2015 | Murakami |
| 2016/0155376 | A1* | 6/2016 | Shin ...................... G09G 3/3208 345/690 |
| 2018/0047801 | A1* | 2/2018 | Xu ...................... G09G 3/2092 |
| 2020/0342807 | A1* | 10/2020 | Li ...................... G09G 3/006 |

FOREIGN PATENT DOCUMENTS

| | | | |
|---|---|---|---|
| CN | 103680370 A | 3/2014 | |
| CN | 105448265 | * 3/2016 | ............... G09G 3/36 |
| CN | 105448265 A | * 3/2016 | ........... G09G 3/3677 |
| CN | 105575305 A | 5/2016 | |
| CN | 109949729 A | 6/2019 | |
| CN | 211603773 U | 9/2020 | |
| CN | 112384969 A | 2/2021 | |
| JP | 8185144 A | 7/1996 | |
| TW | 200712640 A | 4/2007 | |

\* cited by examiner

DISPLAY APPARATUS, DRIVE CHIP, AND ELECTRONIC DEVICE

CROSS-REFERENCE TO RELATED APPLICATIONS

This application is a National Stage of International Application No. PCT/CN2021/119662, filed on Sep. 22, 2021, which claims priority to Chinese Patent Application No. 202011066174.X, filed on Sep. 30, 2020, both of which are hereby incorporated by reference in their entireties.

TECHNICAL FIELD

This application relates to the field of display technologies, and in particular, to a display apparatus, a drive chip, and an electronic device.

BACKGROUND

With development of display technologies, mobile phones, computers, televisions, and smart wearable devices with display functions are becoming increasingly important in people's work and life, and users have higher requirements for quality of these display products. In both a liquid crystal display technology and an organic self-luminous display technology, various signal lines need to be disposed in a display panel to implement display. However, due to a process of the signal lines or other reasons, there is a risk of disconnection of the signal lines, and consequently, black lines or white lines appear during display, which affects a display effect, or even affects accuracy of displayed information.

Currently, a method for repairing a disconnected signal line of a display is to physically connect the disconnected signal line to a reserved signal line through laser sintering, and electrically connect the reserved signal line to an output end of a drive chip to wind from a non-display area of the display to an end of the signal line away from the drive chip. A signal transmitted by the reserved signal line is the same as a signal that should be transmitted by the disconnected signal line, thereby ensuring that the display can display normally.

However, the existing method for repairing a disconnected line requires a manual operation after the display is returned to a factory. This process is cumbersome, costly, and inefficient.

SUMMARY

This application provides a display apparatus, a drive chip, and an electronic device, so as to resolve the foregoing problems.

According to a first aspect, this application provides a display apparatus, including a plurality of sub-pixels for light-emitting display, a plurality of signal lines electrically connected to the plurality of sub-pixels and providing a signal required for light-emitting display to the plurality of sub-pixels, a signal line repair module that is electrically connected to the plurality of signal lines and configured to repair a disconnected signal line, and a drive chip electrically connected to the plurality of signal lines and the signal line repair module and configured to provide the signal required for controlling the light-emitting display of the sub-pixels to the signal lines; the signal line repair module includes a plurality of connection switches and a plurality of sequentially-cascaded first shift units that are disposed in a one-to-one correspondence, where an input end of each connection switch is electrically connected to one signal line, an output end thereof is electrically connected to another signal line, and a shift output end of each first shift unit is electrically connected to a control end of a corresponding connection switch; when determining that a disconnected signal line exists, the drive chip sends a control signal to the signal line repair module, so that the shift output ends of a plurality of shift units sequentially output enable signals, and the first shift unit corresponding to a connection switch electrically connected to the disconnected signal line continuously outputs enable signals, to control the connection switch electrically connected to the disconnected signal line to be continuously turned on, so that the disconnected signal line is electrically connected to another signal line.

According to a second aspect, this application provides a drive chip, which is configured to provide a signal to a plurality of signal lines to control sub-pixels to perform light-emitting display; and provide a control signal when determining that a disconnected signal line exists, so that the disconnected signal line is electrically connected to another signal line. Providing a control signal, so that the disconnected signal line is electrically connected to another signal line specifically includes: providing a control signal to control shift output ends of a plurality of first shift units to sequentially output enable signals, and enabling the first shift unit corresponding to a connection switch electrically connected to the disconnected signal line to continuously output enable signals in a display stage, to control the connection switch electrically connected to the disconnected signal line to be continuously turned on, so that the disconnected signal line is electrically connected to another signal line.

According to a third aspect, this application provides an electronic device, including the display apparatus according to the first aspect.

In the display apparatus, the drive chip, and the electronic device according to embodiments of this application, the signal line repair module may repair a disconnected signal line, that is, the display apparatus may repair the disconnected signal line without being returned to a factory, which is easy to implement, has high repair efficiency, and requires low costs; and a structure for controlling connection of connection switches is first shift units that may sequentially output enable signals, so that manual laser sintering is not required, and accuracy is high.

DESCRIPTION OF EMBODIMENTS

Terms used in implementations of this application are only used to explain specific embodiments of this application, and are not intended to limit this application.

Figure 1:
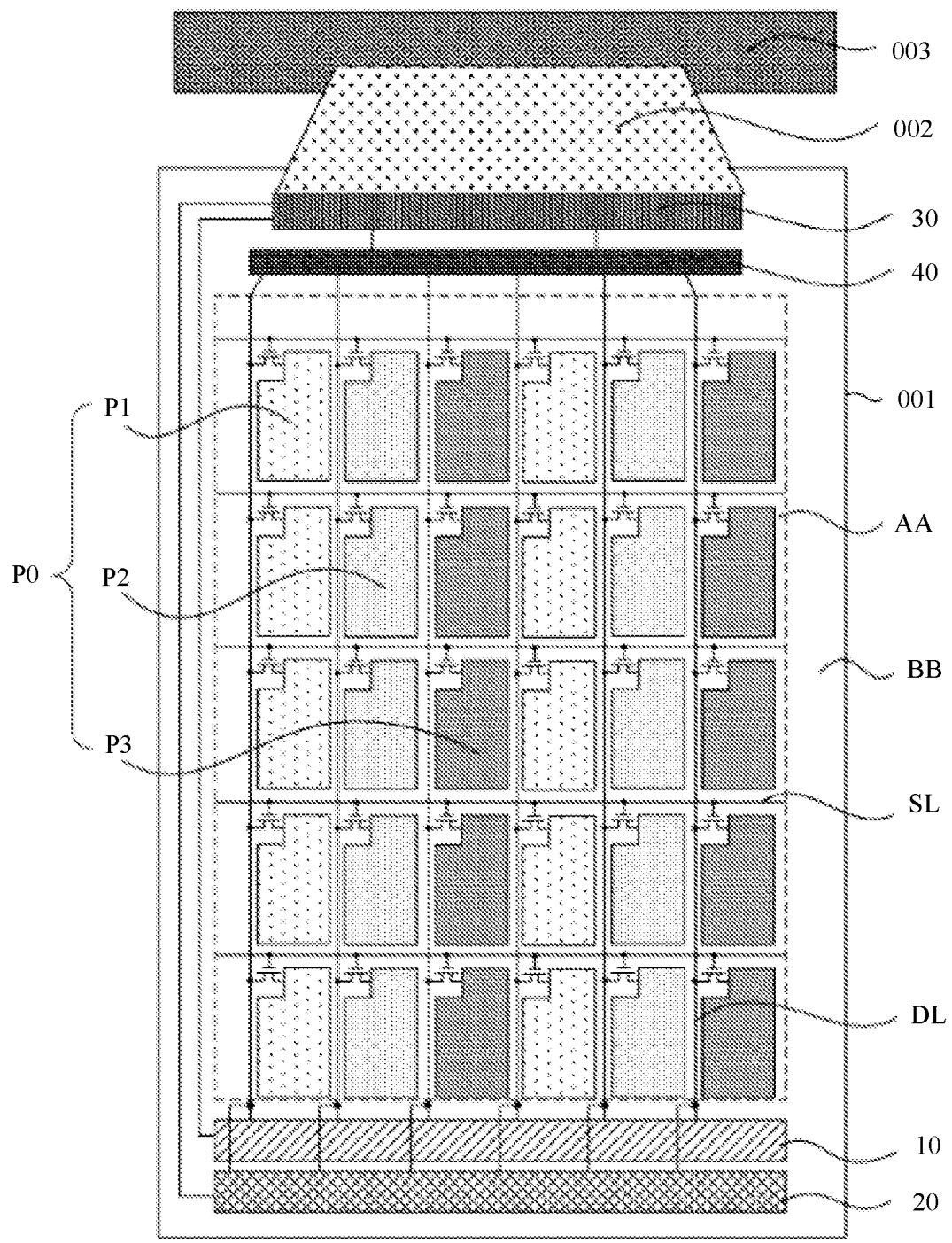
FIG. 1 is a schematic diagram of a display apparatus according to an embodiment of this application.
Figure 2:
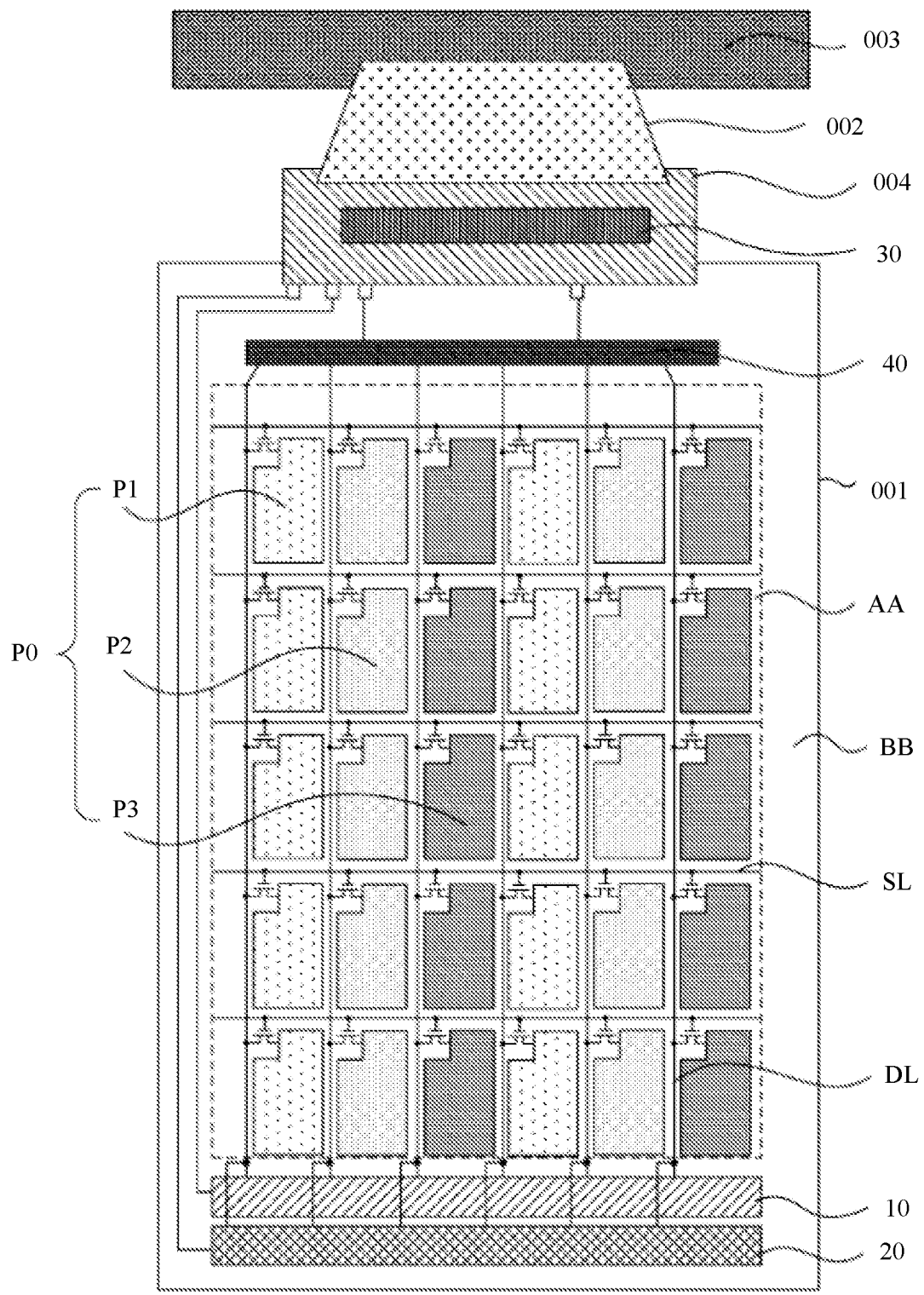
FIG. 2 is a schematic diagram of another display apparatus according to an embodiment of this application.

FIG. 1 is a schematic diagram of a display apparatus according to an embodiment of this application, and FIG. 2 is a schematic diagram of another display apparatus according to an embodiment of this application.

As shown in FIG. 1 and FIG. 2, the display apparatus according to this embodiment of this application includes a display panel 001, and the display panel 001 includes a display area AA and a non-display area BB surrounding the display area AA.

A plurality of signal lines are disposed in the display area AA. The signal lines include first signal lines DL and second signal lines SL, extension directions of the first signal lines DL and the second signal lines SL cross each other, and the first signal lines DL and the second signal lines SL cross to define a plurality of sub-pixels P0. The sub-pixels P0 are used for light-emitting display, the first signal lines DL and the second signal lines SL are electrically connected to the corresponding sub-pixels P0, and the sub-pixels P0 provide a signal required for light-emitting display. The plurality of sub-pixels P0 include at least sub-pixels P0 with three light-emitting colors, and sub-pixels in a same column have a same light-emitting color. For example, the plurality of sub-pixels P0 include first-color sub-pixels P1, second-color sub-pixels P2, and third-color sub-pixels P3, and the first-color sub-pixels P1, the second-color sub-pixels P2, and the third-color sub-pixels P3 are located in different columns respectively.

The non-display area BB includes a signal line repair module 10, and the signal line repair module 10 may repair a disconnected first signal line DL in a signal line repair stage of the display apparatus.

It should be noted that the signal line repair module 10 is electrically connected to a plurality of first signal lines DL, and may repair the disconnected first signal line DL, and the first signal line DL may be either a data line or a scanning line. The signal line repair module may also be electrically connected to a plurality of second signal lines SL, and may repair a disconnected second signal line SL. The first signal lines DL may be data lines that extend in a column direction and are arranged in a row direction, and the first signal lines DL may provide a data signal required for light-emitting display to the sub-pixels P0. The second signal lines SL may be scanning lines that extend in the row direction and are arranged in the column direction, and the second signal lines SL may provide a scanning signal required for light-emitting display to the sub-pixels P0. Alternatively, the first signal lines DL may be scanning lines that extend in the row direction and are arranged in the column direction, and the first signal lines DL may provide a scanning signal required for light-emitting display to the sub-pixels P0. The second signal lines SL may be data lines extending in the column direction and arranged in the row direction, and the second signal lines SL may provide a data signal required for light-emitting display to the sub-pixels P0. In this embodiment of this application, the inventive concept of this application is mainly explained by using the signal line repair module for repairing the first signal lines DL as an example, but it may be understood that the signal line repair module 10 in this embodiment of this application may also be configured to repair the second signal lines SL.

In an embodiment, the display apparatus is a liquid crystal display apparatus, and the display panel 001 includes an array substrate, a color film substrate, and a liquid crystal molecular layer located between the array substrate and the color film substrate. The array substrate includes a plurality of pixel circuits located in the display area AA, the color film substrate includes a color resist layer and a black matrix, and the color resist layer includes at least color resists of different colors. Optionally, the display panel further includes a touch module located on a side of the color film substrate away from the array substrate. In this embodiment of this application, the signal line repair module 10 is added to the display panel, where the signal line repair module 10 is located in the non-display area Bb, and the signal line repair module 10 is disposed on the array substrate.

In another embodiment, the display apparatus may also be an organic light emitting display panel, and the display panel 001 includes an array substrate, a light-emitting device layer, and a packaging structure that are sequentially arranged. Optionally, the display panel further includes a touch module located on a side of the packaging structure away from the array substrate. The light-emitting device layer includes a plurality of light-emitting devices, and the light-emitting devices each include an anode, a light-emitting layer, and a cathode that are stacked. The packaging structure is configured to package and protect the light-emitting devices to ensure service lives of the light-emitting devices. In this embodiment of this application, the signal line repair module 10 is added to the display panel, where the signal line repair module 10 is located in the non-display area BB, and the signal line repair module 10 is disposed on the array substrate.

In another embodiment, the display apparatus may alternatively be any display apparatus in an existing technology, such as a micro LED (light emitting diode) display apparatus or an electrophoretic display apparatus.

The display apparatus according to this embodiment of this application further includes a drive chip, and the drive chip is configured to provide a signal required for controlling light-emitting display of the sub-pixels P0 to the first signal lines DL and the second signal lines SL. The drive chip may use a line disconnection detection circuit to implement automatic detection of a disconnected signal line. For details, refer to patent application No. CN202011014217.X filed on Sep. 24, 2020 and entitled "METHOD FOR DETECTING DEFECT OF DISPLAY LINE". Certainly, the display apparatus may also detect whether a signal line is subjected to a disconnection fault by using another method. Details are not described herein again.

In an embodiment of this application, as shown in FIG. 1 and FIG. 2, the signal line repair module 10 is disposed at an end of each first signal line DL in an extension direction, so as to facilitate electrical connection to the first signal line DL. In an implementation, as shown in FIG. 1, a drive chip 30 is disposed at one end of each first signal line DL, the drive chip 30 is electrically connected to a mainboard 003 by using a flexible circuit board 002, and a signal line repair module 10 is disposed at the other end of the first signal line DL. In another implementation, as shown in FIG. 2, a chip on film 004 is bound to one end of each first signal line DL, a drive chip 30 is disposed on a flexible circuit board of the chip on film 004, the chip on film 004 is electrically connected to a mainboard 003 by using a flexible circuit board 002, and a signal line repair module 10 is disposed at the other end of the first signal line DL. In addition, the drive chip 30 may provide a signal to the first signal lines DL by using a multiplex selection circuit 40, that is, one port of the drive chip 30 corresponds to one input port of the multiplex selection circuit 40, and one input port of the multiplex selection circuit 40 corresponds to a plurality of output ports in a one-to-one correspondence with the first signal lines DL.

The signal line repair module 10 and the drive chip 30/multiplex selection circuit 40 are disposed at two opposite ends of each first signal line DL, and the signal line repair module 10 may repair a disconnected first signal line DL without preventing the drive chip 30 from providing a signal to the first signal lines DL.

Figure 3:
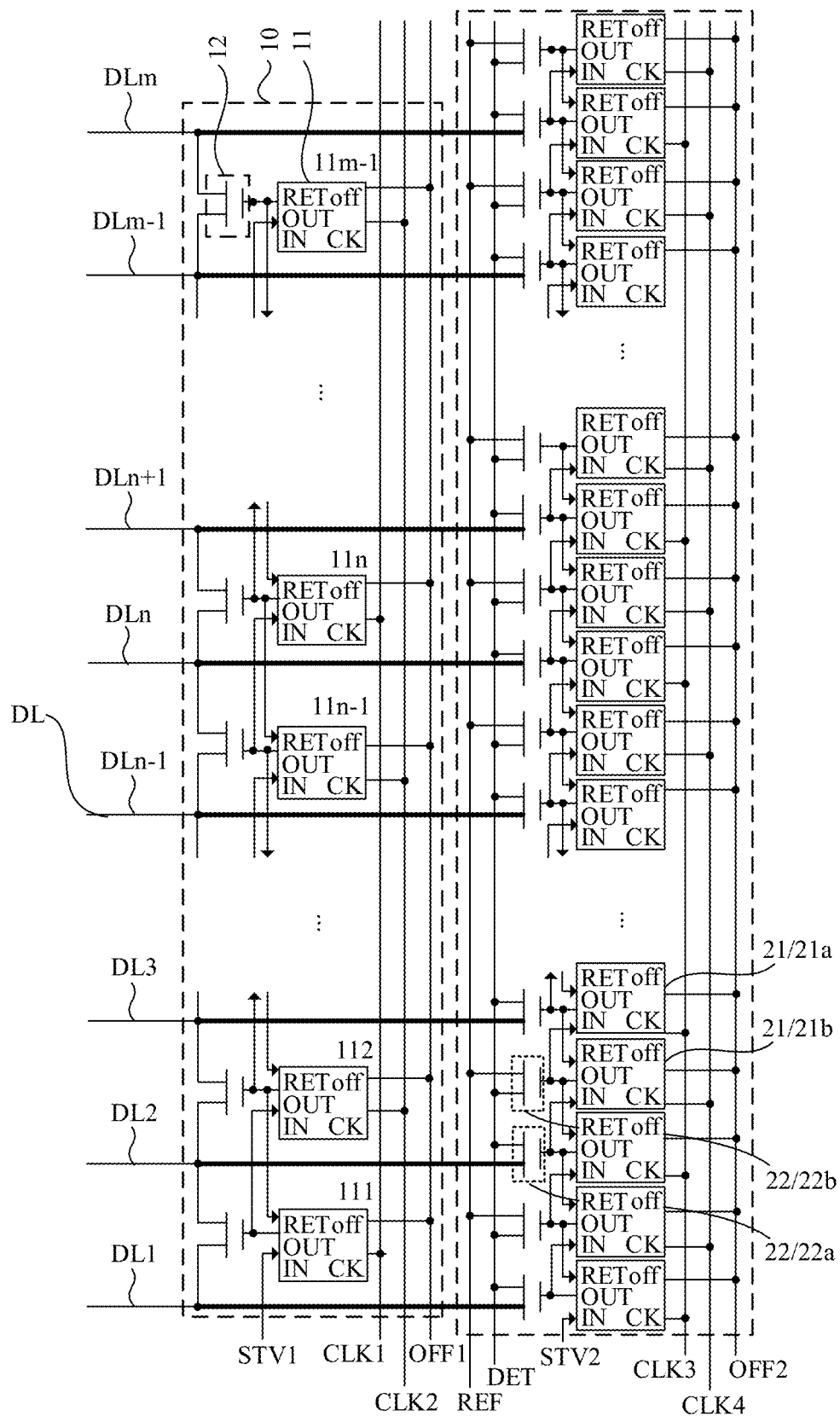
FIG. 3 is a partial enlarged view of a display apparatus according to an embodiment of this application.

FIG. 3 is a partial enlarged view of a display apparatus according to an embodiment of this application. As shown in FIG. 3, the signal line repair module 10 according to this embodiment of this application includes a plurality of connection switches 12, where an input end of each connection switch 12 is electrically connected to one first signal line DL, and an output end of the connection switch 12 is electrically connected to another first signal line DL. When any one of the connection switches 12 is turned on, two first signal lines DL that are electrically connected to the input end and the output end of the connection switch 12 respectively are electrically connected to each other. Then, when any one of the first signal lines DL is disconnected, by turning on one connection switch 12 electrically connected to the disconnected first signal line DL, the disconnected first signal line DL may be electrically connected to another first signal line DL, thereby repairing the disconnected first signal line DL.

As shown in FIG. 3, the signal repair module 10 according to this embodiment of this application further includes a plurality of first shift units 11, and the plurality of first shift units 11 may be sequentially cascaded and may sequentially output enable signals. The plurality of first shift units 11 are disposed in a one-to-one correspondence with the plurality of first connection switches 12, a shift output end OUT of each first shift unit 11 is electrically connected to a control end of a corresponding connection switch 12, and a signal output by the shift output end OUT thereof controls the connection switch 12 to be turned on or turned off. In this embodiment of this application, the shift output ends OUT of the plurality of first shift units 11 cascaded in the signal line repair module 10 sequentially output enable signals, so that the connection switches 12 electrically connected to the plurality of stages of first shift units 11 cascaded in the signal line repair module 10 respectively may be controlled to be sequentially turned on. When one first signal line DL is disconnected, one connection switch 12 electrically connected to the disconnected first signal line DL may be controlled by a first shift unit 11 to be turned on in the signal line repair stage, and the first shift unit 11 may remain in a state of outputting enable signals in a display stage, so that the disconnected first signal line DL is electrically connected to another first signal line DL, and may also receive a signal in the display stage, and that another first shift unit 11 stops outputting an enable signal does not affecting signal receiving by a normal first signal line DL.

The drive chip 30 is electrically connected to a plurality of first signal lines DL and the signal line repair module 10, and is configured to provide a signal required for controlling light-emitting display of the sub-pixels to the first signal lines DL.

When determining that a first signal line DL is disconnected, the drive chip 30 sends a control signal to the signal line repair module 10, to control shift output ends OUT of a plurality of first shift units 11 to sequentially output enable signals, and control the shift output end OUT of the first shift unit 11 corresponding to the disconnected first signal line DL to output an enable signal and then keep outputting the enable signal, so that a connection switch 12 corresponding to the disconnected first signal line DL is still turned on, and the disconnected first signal line DL is electrically connected to the first signal line DL electrically connected to the connection switch 12.

If a position at which a first signal line DL is disconnected is in the display area AA, in the display stage, a line segment of the disconnected first signal line DL that is electrically connected to the signal line repair module 10 may also receive a display signal, and the display signal is the same as a display signal of a first signal line DL to which this first signal line DL is electrically connected by using the connection switch 12. A line segment of the disconnected first signal line DL that is not electrically connected to the signal line repair module 10 may normally receive the display signal. If a position at which a first signal line DL is disconnected is in the non-display area BB, in the display stage, the disconnected first signal line DL may receive a display signal, and the display signal is the same as a display signal of a first signal line DL to which this first signal line DL is electrically connected by using the connection switch 12.

The display apparatus according to this embodiment of this application includes a signal line repair module 10, and the signal line repair module 10 may repair a disconnected first signal line DL, that is, the display apparatus may repair the disconnected first signal line without being returned to a factory, which is easy to implement, has high repair efficiency, and requires low costs. In this embodiment of this application, a structure for controlling connection of the connection switches 12 is the first shift units 11 that may sequentially output enable signals, so that manual laser sintering is not required, and accuracy is high.

In an embodiment of this application, the connection switch 12 may be a transistor, and then a control end, an input end, and an output end of the connection switch 12 may be a gate, a source, and a drain of the transistor, respectively.

Figure 4:
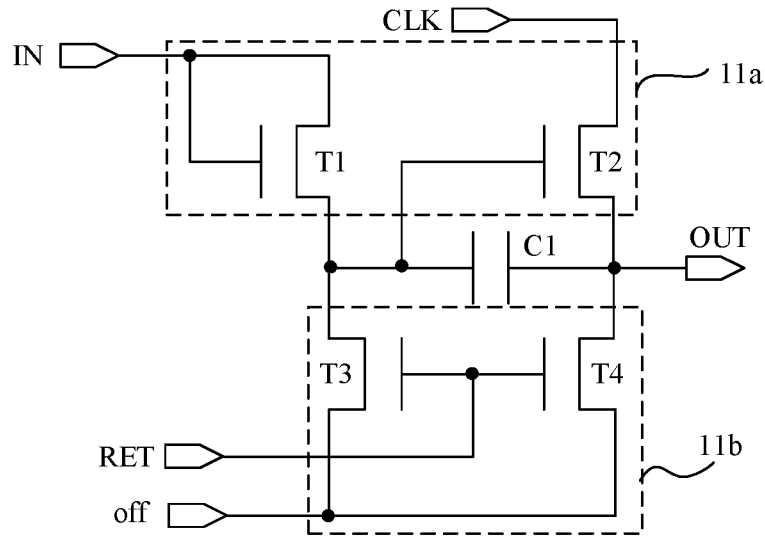
FIG. 4 is a schematic diagram of an equivalent circuit diagram of a shift unit according to an embodiment of this application.
Figure 5:
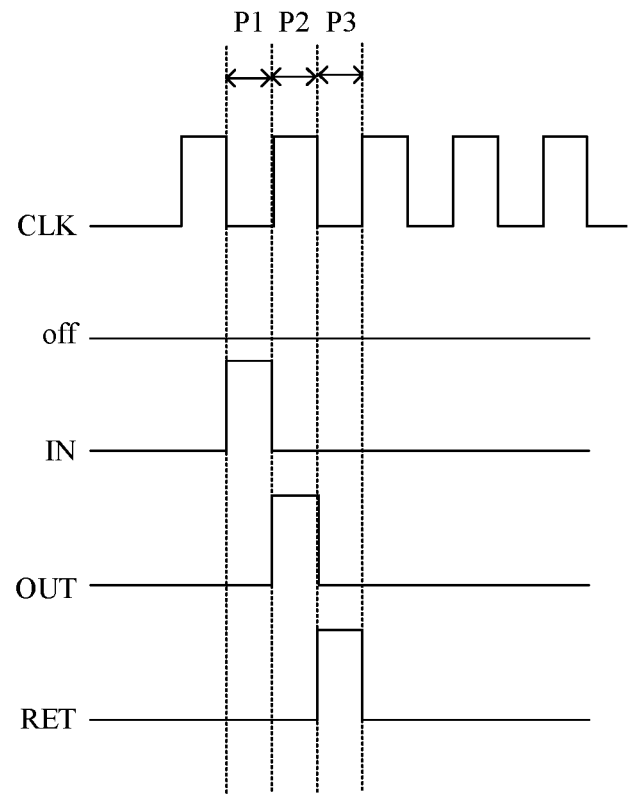
FIG. 5 is a sequence diagram of a shift unit according to the embodiment shown in FIG. 4.

FIG. 4 is a schematic diagram of an equivalent circuit diagram of a shift unit according to an embodiment of this application, and FIG. 5 is a sequence diagram of a shift unit according to the embodiment shown in FIG. 4. The structure and operation process of the first shift unit 11 in this embodiment of this application are illustrated below with reference to FIG. 4 and FIG. 5 as an example.

As shown in FIG. 4, a first shift unit 11 includes an output subunit 11a and a reset subunit 11b, where the output subunit 11a includes a turn-on signal input end IN and a clock signal input end CLK; and the reset subunit 11b includes a reset control signal input end RET and a reset signal input end off.

The output subunit 11a is configured to control, under control of a signal of the turn-on signal input end IN and a signal of the clock signal input end CLK, a shift output end OUT of the first shift unit 11 to output an enable signal that enables a connection switch 12 to be turned on. The reset subunit 11b is configured to control, under control of a signal of the reset control signal input end RET and a signal of the reset signal input end off, the shift output end OUT of the first shift unit 11 to output a reset signal, and the reset signal enables the connection switch 12 to be turned off.

The turn-on signal input end IN, the clock signal input end CLK, the reset control signal input end RET, and the reset signal input end off are all electrically connected to the drive chip 30, and obtain, from the drive chip 30, a signal for driving the first shift unit 11 to operate.

As shown in FIG. 4, the output subunit 11a further includes a first transistor T1, a second transistor T2, and a first capacitor C1. A gate and a source of the first transistor T1 are both connected to the turn-on signal input end IN, and a drain thereof is electrically connected to a first polar plate of the first capacitor C1; a gate of the second transistor T2 is electrically connected to the first polar plate of the first capacitor C1, a source thereof is electrically connected to the clock signal input end CLK, and a drain thereof is electrically connected to the shift output end OUT. A second polar plate of the first capacitor C1 is electrically connected to the shift output end OUT. As shown in FIG. 4, the reset subunit 11b includes a third transistor T3 and a fourth transistor T4. A gate of the third transistor T3 is electrically connected to the reset control signal input end RET, a source thereof is electrically connected to the reset signal input end off, and a drain thereof is electrically connected to the first polar plate of the capacitor; a gate of the fourth transistor T4 is electrically connected to the reset control signal input end RET, a source thereof is electrically connected to the reset signal input end off, and a drain thereof is electrically connected to the shift output end out.

It should be noted that FIG. 4, FIG. 5, and the following descriptions are based on an example in which T1 to T4 are N-type transistors. In fact, T1 to T4 may alternatively be P-type transistors. FIG. 5 shows three operating stages of the first shift unit 11.

In the first stage P1, when the turn-on signal input end IN receives an active signal, that is, a high-level signal, the first transistor T1 is turned on, and the active signal received by the turn-on signal input end IN is transmitted to the first polar plate of the first capacitor C1 by using the first transistor T1 that is turned on. Because the gate of the second transistor T2 is electrically connected to the first polar plate of the first capacitor C1, the second transistor T2 is turned on and remains in an on state. In this case, if a pulse signal received by the clock signal input end CLK is a low-level signal or an inactive-level signal, the shift output end OUT outputs a low-level signal or an inactive-level signal.

In the second stage P2, due to the action of the first capacitor C1, the second transistor T2 is continuously turned on, the pulse signal received by the clock signal input end CLK is an active signal, and the shift output end OUT outputs an enable signal.

In the third stage P3, when the reset control signal input end RET receives an active signal, that is, a high-level signal, the third transistor T3 and the fourth transistor T4 are turned on. The third transistor T3 provides a reset signal received by the reset signal input end off to the first polar plate of the first capacitor C1 and the gate of the second transistor T2, and the second transistor T2 is turned off. The fourth transistor T4 provides the reset signal received by the reset signal input end off to the shift output end OUT, to reset the shift output end OUT.

As shown in FIG. 3, the shift output end OUT of the first shift unit 11 of the previous stage in two adjacent stages of first shift units 11 among the cascaded first shift units 11 included in the signal repair module 10 is electrically connected to the turn-on signal input end IN of the first shift unit 11 of the next stage, and the shift output end OUT of the first shift unit 11 of the next stage is electrically connected to the reset control signal input end RET of the first shift unit 11 of the previous stage. That is, the shift output end OUT of the first shift unit 11 of the previous stage may not only output an enable signal to control a connection switch 12 electrically connected thereto to be turned on, but also provide an enable signal to the turn-on signal input end IN of the first shift unit 11 of the next stage to control the first shift unit 11 of the next stage to start operating; and the shift output end OUT of the first shift unit 11 of the next stage may not only output an enable signal to control a connection switch 12 electrically connected thereto to be turned on, but also may provide an enable signal to the reset control signal input end RET of the first shift unit 11 of the previous stage to control the first shift unit 11 of the previous stage to stop operating. It should be noted that a turn-on signal input end IN of a first-stage shift unit among the cascaded first shift units 11 is electrically connected to a start signal line, for example, a first start signal line STV1, and the start signal line may provide an enable signal to the turn-on signal input end IN of the first-stage shift unit.

As shown in FIG. 3, clock signal input ends CLK of two adjacent stages of first shift units 11 among the cascaded first shift units 11 included in the signal repair module 10 are connected to different clock signal lines. As shown in FIG. 3, clock signal input ends CLK of a plurality of stages of first shift units 11 in the signal repair module 10 are alternately electrically connected to the first clock signal line CLK1 and the second clock signal line CLK2, and the first clock signal line CLK1 and the second clock signal line CLK2 output pulse signals alternately, so that the first shift units 11 cascaded in the signal repair module 10 may sequentially output enable signals in cooperation with a signal received by the turn-on signal input end IN.

As shown in FIG. 3, reset signal input ends off of the first shift units 11 included in the signal line repair module 10 may be all electrically connected to a same reset signal line, and the reset signal line may continuously transmit reset signals in a signal line repair stage. For example, the reset signal input ends off are electrically connected to a first reset signal line OFF1, and the first reset signal line OFF1 continuously outputs reset signals in the signal line repair stage.

Figure 6:
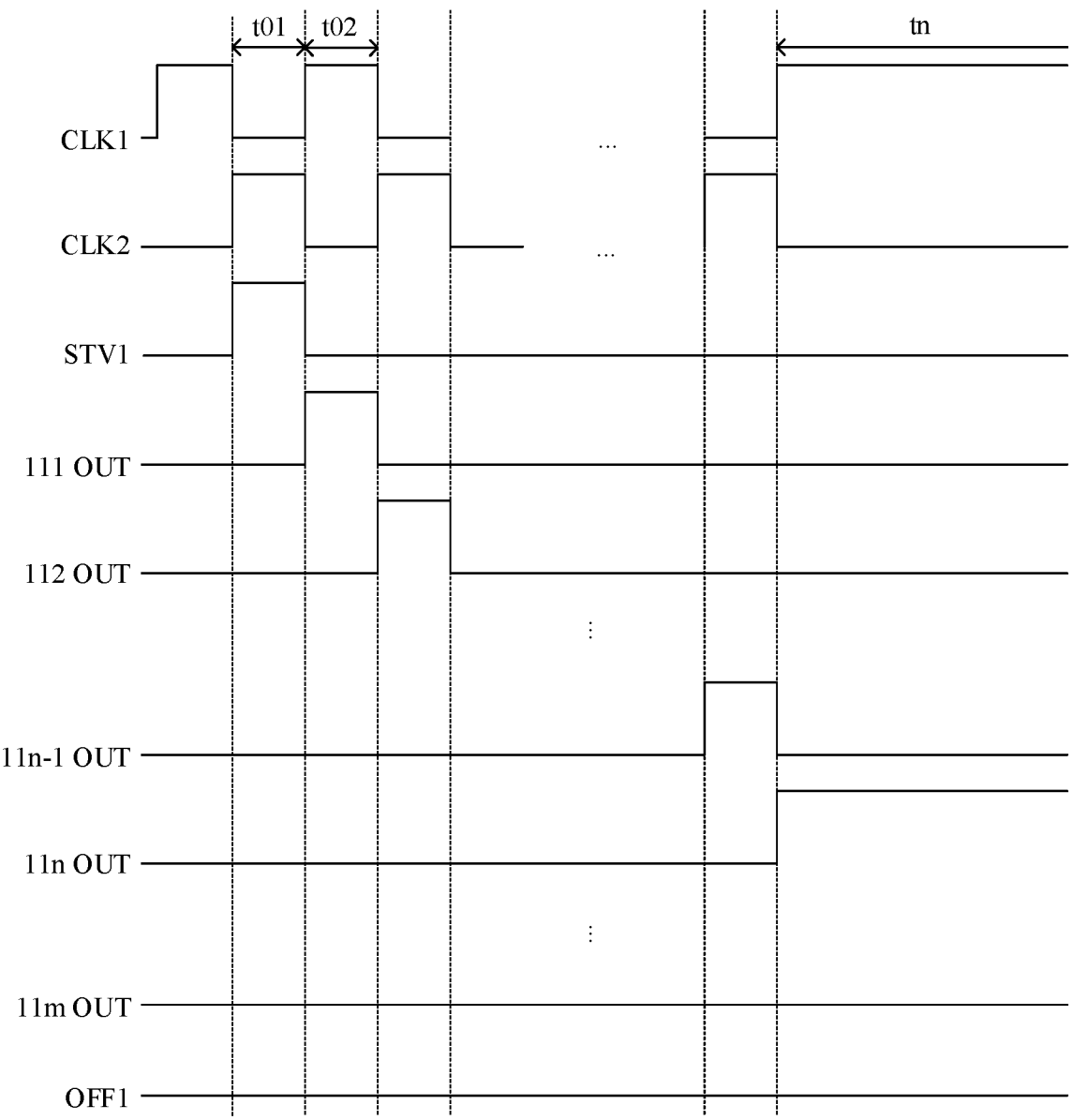
FIG. 6 is a sequence diagram of a signal line repair stage of the display apparatus shown in FIG. 3.

FIG. 6 is a sequence diagram of a signal line repair stage of the display apparatus shown in FIG. 3. The operation process of the signal line repair module 10 in this application is described below with reference to FIG. 3 and FIG. 6. As shown in FIG. 3, the signal line repair module 10 includes m−1 stages of cascaded first shift units 11: a first-stage first shift unit 111, a second-stage first shift unit 112, . . . , a $(n-1)^{th}$-stage first shift unit 11($n$−1), an $n^{th}$-stage shift unit n, . . . , a $(m-1)^{th}$-stage first shift unit 11($m$−1), where m is a positive integer greater than or equal to 3. It should be noted that the following describes the operating principle of m−1 stages of cascaded first shift unit 11, and the following operating principle is also applicable to a case in which a quantity of stages of cascaded first shift unit 11 is not m−1. The specific operation process of the signal line repair module 10 is as follows.

At a time t1, the turn-on signal input end IN of the first-stage first shift unit 111 in the signal repair module 10 receives an active signal transmitted by the first start signal line STV1, then the first clock signal line CLK1 connected to the clock signal input end CLK of the first-stage first shift unit 111 transmits an active signal, then the shift output end OUT of the first-stage first shift unit 111 outputs an enable signal, and the connection switch 12 electrically connected to the shift output end OUT of the first-stage first shift unit 111 is turned on.

At a time t2, the turn-on signal input end IN of the second-stage first shift unit 112 in the signal repair module 10 receives the active signal output by the shift output end OUT of the first-stage first shift unit 111, then the second clock signal line CLK2 connected to the clock signal input end CLK of the second-stage first shift unit 112 transmits an active signal, then the shift output end OUT of the second-stage first shift unit 112 outputs an enable signal, and the connection switch 12 electrically connected to the shift output end OUT of the second-stage first shift unit 112 is turned on. In addition, the reset control signal input end RET of the first-stage first shift unit 111 receives the enable signal output by the shift output end OUT of the second-stage first shift unit 112, then a reset signal transmitted by the first reset signal line OFF1 controls the first-stage first shift unit 111 to be turned off and the shift output end OUT of the first-stage first shift unit 111 is reset, and the connection switch 12 electrically connected to the shift output end OUT of the first-stage first shift unit 111 is turned off.

By analogy, at a time tn, the turn-on signal input end IN of the $n^{th}$-stage first shift unit 11n in the signal repair module 10 receives an enable signal output by the shift output end OUT of the $(n-1)^{th}$-stage first shift unit 111. Then, if the clock signal line connected to the clock signal input end CLK of the $n^{th}$-stage first shift unit 11n, for example, the first clock signal line CLK1, transmits an active signal, the shift output end OUT of the $n^{th}$-stage first shift unit 11n outputs an enable signal, and the connection switch 12 electrically connected to the shift output end OUT of the $n^{th}$-stage first shift unit 11n is turned on. When the corresponding connection switch 12 is turned on, the $n^{th}$ first signal line DLn is electrically connected to the $(n+1)^{th}$ second signal line DL(n+1). In addition, the reset control signal input end RET of the $(n-1)^{th}$-stage first shift unit 11(n−1) receives the enable signal output by the shift output end OUT of the $n^{th}$-stage first shift unit 11n, and then a reset signal transmitted by the first reset signal line OFF1 controls the $(n-1)^{th}$-stage first shift unit 11(n−1) to be turned off and the shift output end OUT of the $(n-1)^{th}$-stage first shift unit 11(n−1) is reset.

At the time tn, a clock signal line of the signal repair module 10 that is connected to the clock signal input end CLK of the $n^{th}$-stage first shift unit 11n, for example, the first clock signal line CLK1, keeps transmitting enable signals in the signal line repair stage and the display stage, while other clock signal lines continuously output disable signals, and then the shift output end OUT of the $n^{th}$-stage first shift unit 11n continuously outputs enable signals, while other first shift units 11 are continuously turned off. Then, first signal lines DL electrically connected to the input end and the output end of the connection switch 12 electrically connected to the $n^{th}$-stage first shift unit 11n respectively are continuously electrically connected, and therefore repair of a disconnected first signal line DL electrically connected to the input end or the output end of the connection switch 12 may be completed.

Figure 7:
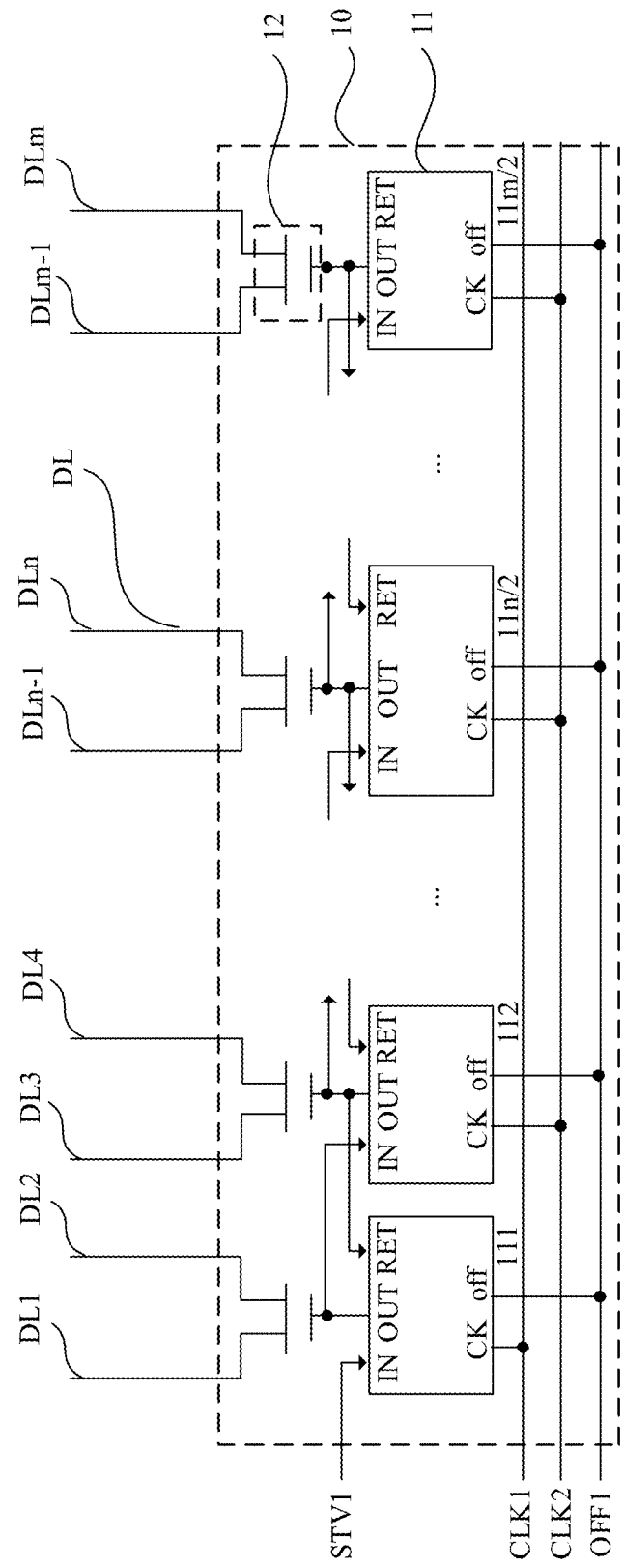
FIG. 7 is a partial enlarged view of another display apparatus according to an embodiment of this application.
Figure 8:
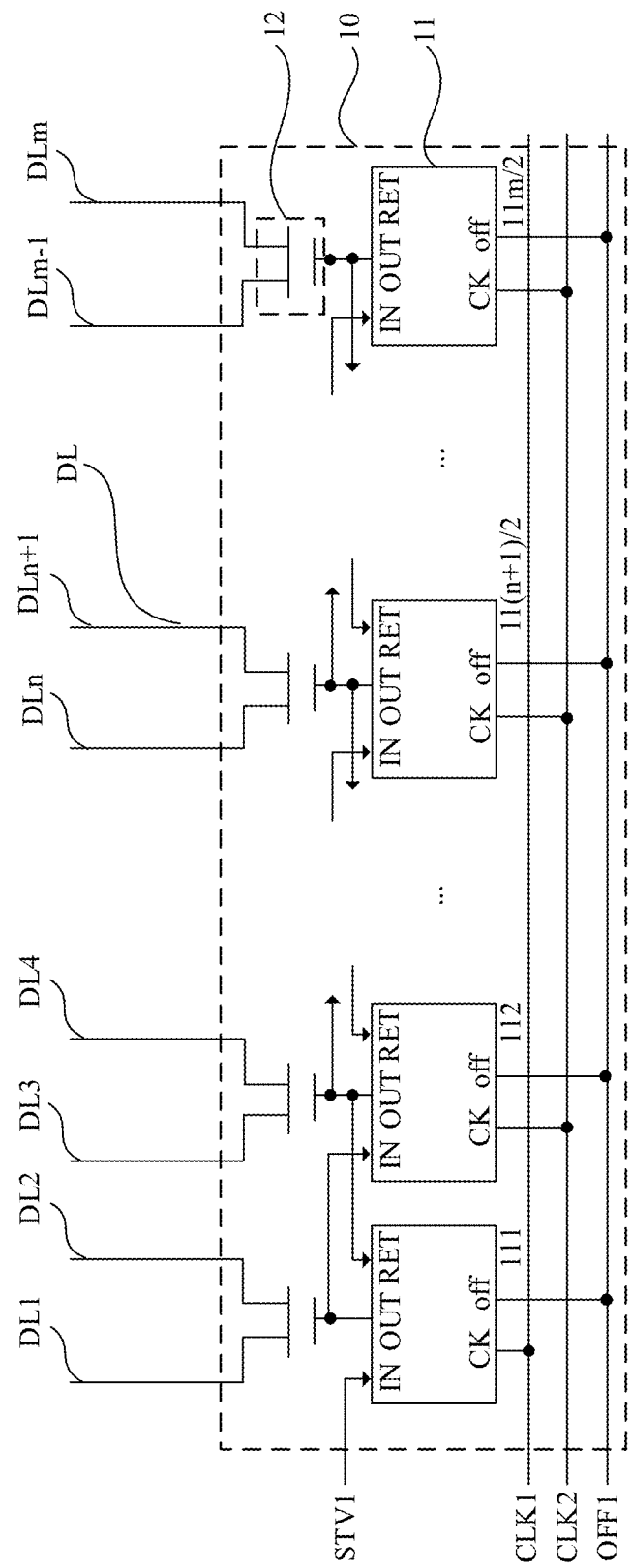
FIG. 8 is a partial enlarged view of still another display apparatus according to an embodiment of this application.

FIG. 7 is a partial enlarged view of another display apparatus according to an embodiment of this application, and FIG. 8 is a partial enlarged view of another display panel according to an embodiment of this application. In an embodiment of this application, as shown in FIG. 3, FIG. 7, and FIG. 8, two first signal lines DL electrically connected to one connection switch 12 in the signal line repair module 10 are adjacent to each other. As shown in FIG. 3, FIG. 7, and FIG. 8, the signal line repair module 10 is electrically connected to m first signal lines DL that are disposed sequentially and adjacently, and the m first signal lines DL that are disposed sequentially and adjacently are a first first signal line DL1, a second first signal line DL2, a third first signal line DL3, . . . , a $(n-1)^{th}$ first signal line DL(n−1), an $n^{th}$ first signal line DLn, a $(n+1)^{th}$ first signal line DL(n+1), . . . , a $(m-1)^{th}$ first signal line DL(m−1), and an $m^{th}$ first signal line DLm.

In an implementation of this embodiment, as shown in FIG. 3, any two adjacent signal lines DL among the plurality of signal lines DL electrically connected to the signal line repair module 10 are electrically connected to an input end and an output end of a same connection switch 12 respectively. That is, the signal line repair module 10 includes m−1 stages of cascaded first shift units 11: a first-stage first shift unit 111, a second-stage first shift unit 112, . . . , a $(n-1)^{th}$-stage first shift unit 11(n−1), an $n^{th}$-stage shift unit n, . . . , and a $(m-1)^{th}$-stage first shift unit 11(m−1); the first first signal line DL1 and the second first shift unit DL2 are electrically connected to an input end and an output end of a connection switch 12 electrically connected to the first-stage first shift unit 111 respectively, the second first signal line DL2 and the third first signal line DL3 are electrically connected to an input end and an output end of a connection switch 12 electrically connected to the second-stage first shift unit 112 respectively, . . . , the $(n-1)^{th}$ first signal line DL(n−1) and the $n^{th}$ first signal line DLn are electrically connected to an input end and an output end of a connection switch 12 electrically connected to the (n−1)th-stage first shift unit 11(n−1) respectively, the $n^{th}$ first signal line DLn and the (n+1)th first signal line DL(n+1) are electrically connected to an input end and an output end of a connection switch 12 electrically connected to the $n^{th}$-stage first shift unit 11n respectively, . . . , and the $(m-1)^{th}$ first signal line DL(m−1) and the $m^{th}$ first signal line DLm are electrically connected to an input end and an output end of a connection switch 12 electrically connected to the $(m-1)^{th}$-stage first shift unit 11(m−1) respectively.

Assuming that the $n^{th}$ first signal line DLn among the m first signal lines DL is disconnected, 1≤n≤m, then the connection switch 12 electrically connected to the $n^{th}$ first signal line DLn is still turned on under control of the corresponding first shift unit 11, while other first shift units 11 are still turned off, thereby completing repair of the $n^{th}$ first signal line DL.

A repair process of a signal line in this application is described below with reference to FIG. 3 and FIG. 6. In the signal line repair module 10, the shift output end OUT of the first-stage first shift unit 111 outputs an enable signal to turn on a corresponding connection switch 12, and the first first signal line DL1 is electrically connected to the second first signal line DL2; the shift output end OUT of the second-stage first shift unit 111 outputs an enable signal to turn on a corresponding connection switch 12, and the second first signal line DL2 is electrically connected to the third first signal line DL2; in addition, the shift output end OUT of the first-stage first shift unit 111 outputs a reset signal to turn off a corresponding connection switch 12, and the first first signal line DL1 is electrically disconnected from the second first signal line DL2; by analogy, the shift output end OUT of the $n^{th}$-stage first shift unit 111 outputs an enable signal to turn on a corresponding connection switch 12, and the $n^{th}$ first signal line DLn is electrically connected to the (n+1)th first signal line DL(n+1); in addition, the shift output end OUT of the $(n-1)^{th}$-stage first shift unit 11(n−1) outputs a reset signal to turn off a corresponding connection switch 12, and the $(n-1)^{th}$ first signal line DL(n−1) is electrically disconnected from the $n^{th}$ first signal line DLn; the shift output end OUT of the $n^{th}$-stage first shift unit 11n continuously outputs an enable signal, and other first shift units 11 are continuously turned off, so that the $n^{th}$ first signal line DLn is continuously electrically connected to the (n+1)th first signal line DL(n+1), thereby implementing repair of the $n^{th}$ first signal line DL. In this embodiment, the $n^{th}$-stage first shift unit 11n continuously outputs an enable signal to control a corresponding connection switch 12 to be continuously turned on, so that the disconnected $n^{th}$ first signal line DLn is electrically connected to the $(n+1)^{th}$ first signal line DL(n+1).

Figure 9:
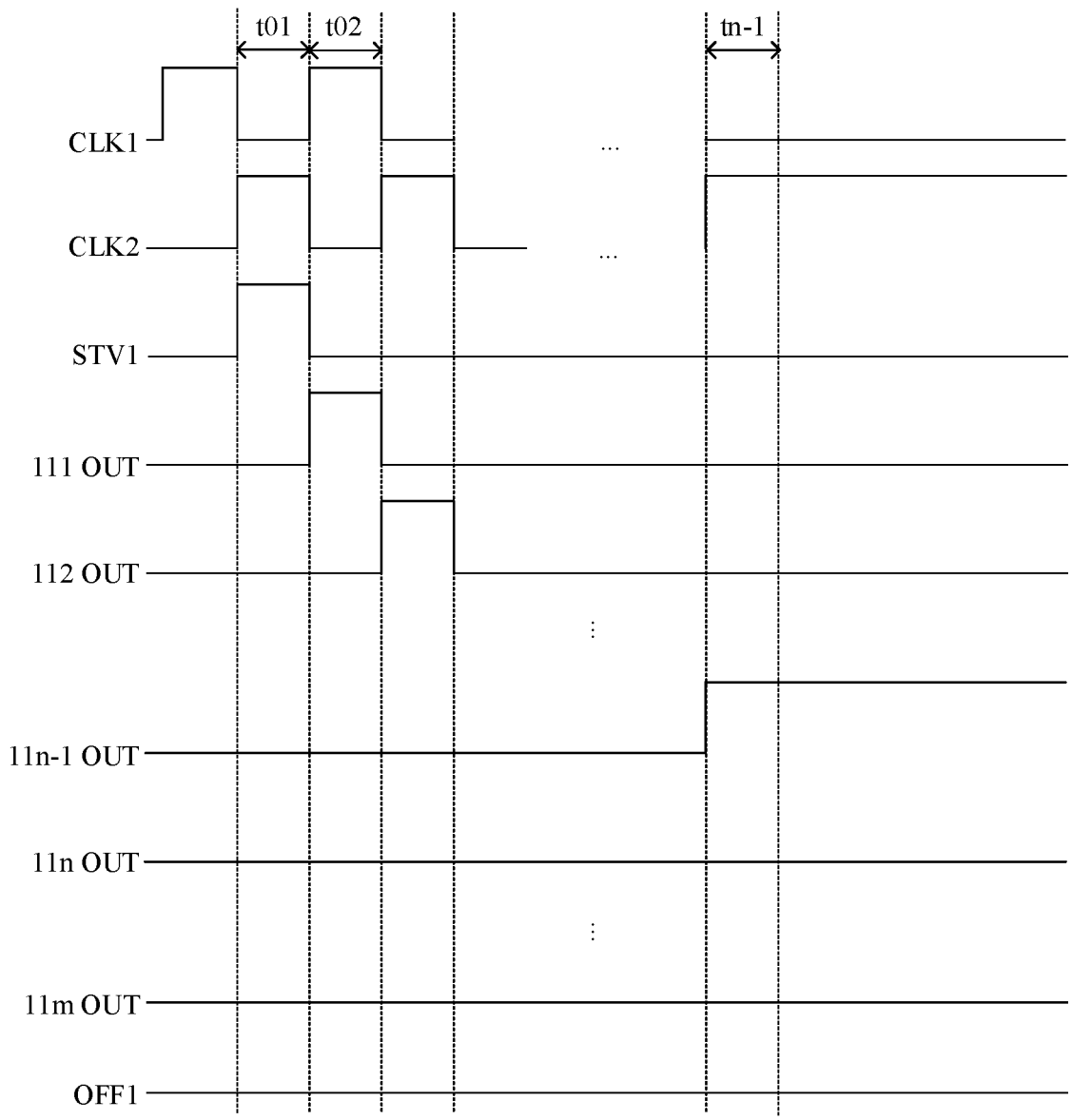
FIG. 9 is another sequence diagram of a signal line repair stage of the display apparatus shown in FIG. 3.

FIG. 9 is another sequence diagram of a signal line repair stage of the display apparatus shown in FIG. 3. It is still assumed that the $n^{th}$ first signal line DLn among the m first signal lines DL is disconnected, and 2≤n≤m. A repair method shown in FIG. 9 differs from the repair method shown in FIG. 6 in that after a turn-on signal input end IN of the $(n-1)^{th}$-stage first shift unit 11(n−1) in the signal line repair module 10 receives an enable signal, a clock signal line connected to a clock signal input end CLK of the $(n-1)^{th}$-stage first shift unit 11(n−1), for example, the second clock signal line CLK2, keeps transmitting an enable signal, then the shift output end OUT of the (n−1)th-stage first shift unit 11(n−1) keeps outputting the enable signal, and a corresponding connection switch 12 is continuously turned on; other clock signal lines continuously output disable signals, and other first shift units 11 are continuously turned off. Correspondingly, the $(n-1)^{th}$ first signal line DL(n−1) is electrically connected to the $n^{th}$ first signal line DLn. In this embodiment, the n-t h-stage first shift unit 11(n−1) continuously outputs an enable signal to control a corresponding connection switch 12 to be continuously turned on, so that the disconnected $n^{th}$ first signal line DLn is electrically connected to the $(n-1)^{th}$ first signal line DL(n−1).

In the embodiment shown in FIG. 3, one first signal line DL may be electrically connected to two adjacent first signal lines DL respectively by using different connection switches 12, so that two methods are available for repair of one first signal line DL, which may improve flexibility of repair.

In another implementation of this embodiment, as shown in FIG. 7 and FIG. 8, every two adjacent signal lines DL among the plurality of signal lines DL electrically connected to the signal line repair module 10 are electrically connected to the input end and the output end of a same connection switch 12 respectively. That is, the signal line repair module 10 includes m/2 stages of cascaded first shift units 11: a first-stage first shift unit 111, a second-stage first shift unit 112, . . . , and a $(m/2)^{th}$-stage first shift unit 11(m/2); the first first signal line DL1 and the second first shift unit DL2 are electrically connected to an input end and an output end of a connection switch 12 electrically connected to the first-stage first shift unit 111 respectively, the third first signal line DL3 and the fourth first shift unit DL4 are electrically connected to an input end and an output end of a connection switch 12 electrically connected to the second-stage first shift unit 112 respectively, . . . , and the $(m-1)^{th}$ first signal line DL(m-1) and the $m^{th}$ first shift unit DLm are electrically connected to an input end and an output end of a connection switch 12 electrically connected to the $(m-2)^{th}$-stage first shift unit 11(m/2) respectively. In this implementation, m is an even number.

Figure 10:
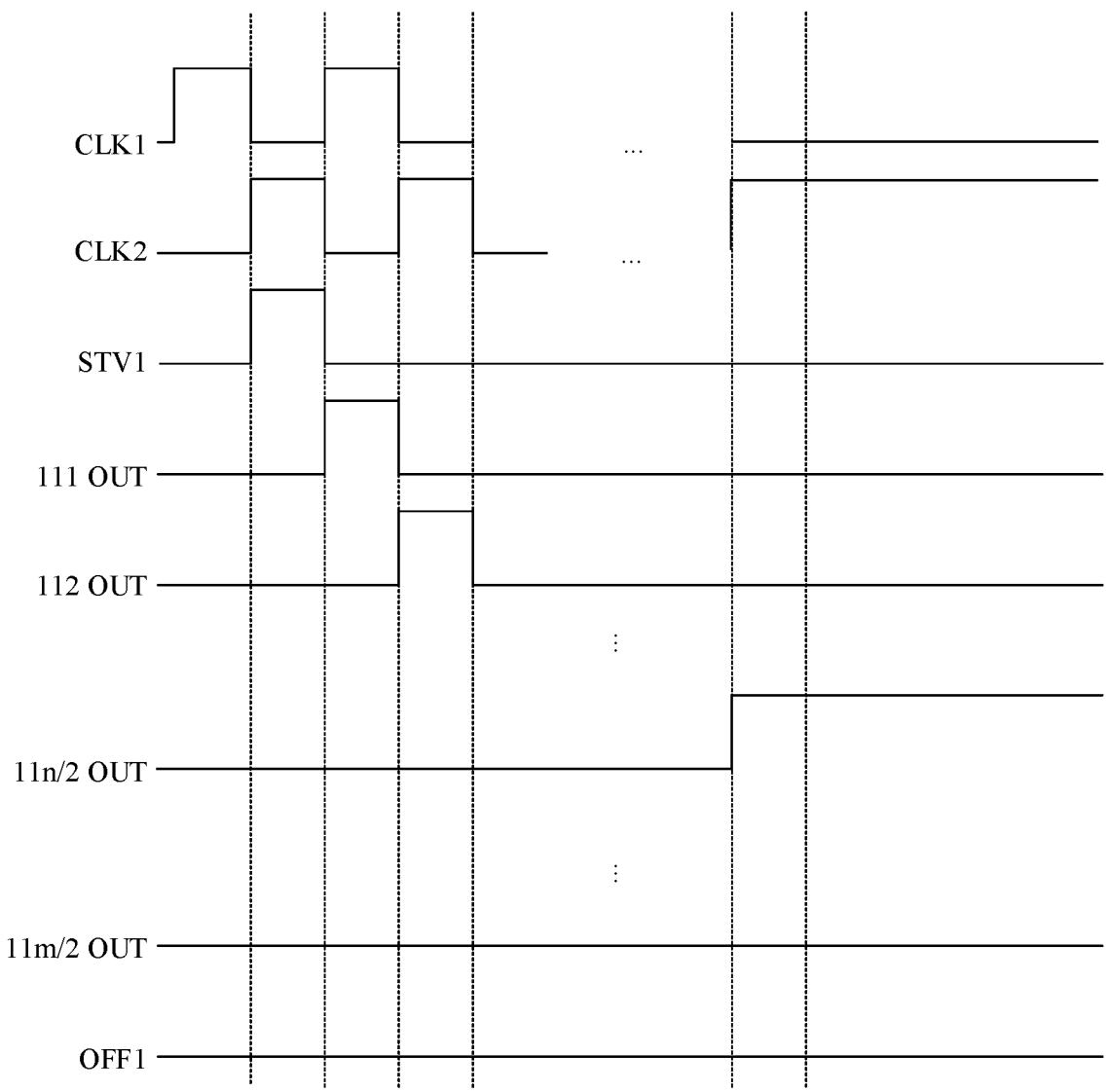
FIG. 10 is a sequence diagram of a signal line repair stage of the display apparatus shown in FIG. 7.

FIG. 10 is a sequence diagram of a signal line repair stage of the display apparatus shown in FIG. 7. Still assuming that the $n^{th}$ first signal line DLn among the m first signal lines DL is disconnected, and n is an even number, the process of repairing the $n^{th}$ first signal line DLn is described below with reference to FIG. 7 and FIG. 10. In the signal line repair module 10, the shift output end OUT of the first-stage first shift unit 111 outputs an enable signal to turn on a corresponding connection switch 12, and the first first signal line DL1 is electrically connected to the second first signal line DL2; the shift output end OUT of the second-stage first shift unit 112 outputs an enable signal to turn on a corresponding connection switch 12, and the third first signal line DL3 is electrically connected to the fourth first signal line DL4; in addition, the shift output end OUT of the first-stage first shift unit 111 outputs a reset signal to turn off a corresponding connection switch 12, and the first first signal line DL1 is electrically disconnected from the second first signal line DL2; by analogy, the shift output end OUT of the $(n/2)^{th}$-stage first shift unit 11(n/2) outputs an enable signal to turn on a corresponding connection switch 12, and the $n^{th}$ first signal line DLn is electrically connected to the $(n-1)^{th}$ first signal line DL(n-1); the shift output end OUT of the $(n/2)^{th}$-stage first shift unit 11(n/2) continuously outputs an enable signal, and other first shift units 11 are continuously turned off, so that the $n^{th}$ first signal line DLn is continuously electrically connected to the $(n-1)^{th}$ first signal line DL(n-1), thereby implementing repair of the $n^{th}$ first signal line DL. In this embodiment, the $(n/2)^{th}$-stage first shift unit 11(n/2) continuously outputs an enable signal to control a corresponding connection switch 12 to be continuously turned on, so that the disconnected $n^{th}$ first signal line DLn is electrically connected to the $(n-1)^{th}$ first signal line DL(n-1).

Figure 11:
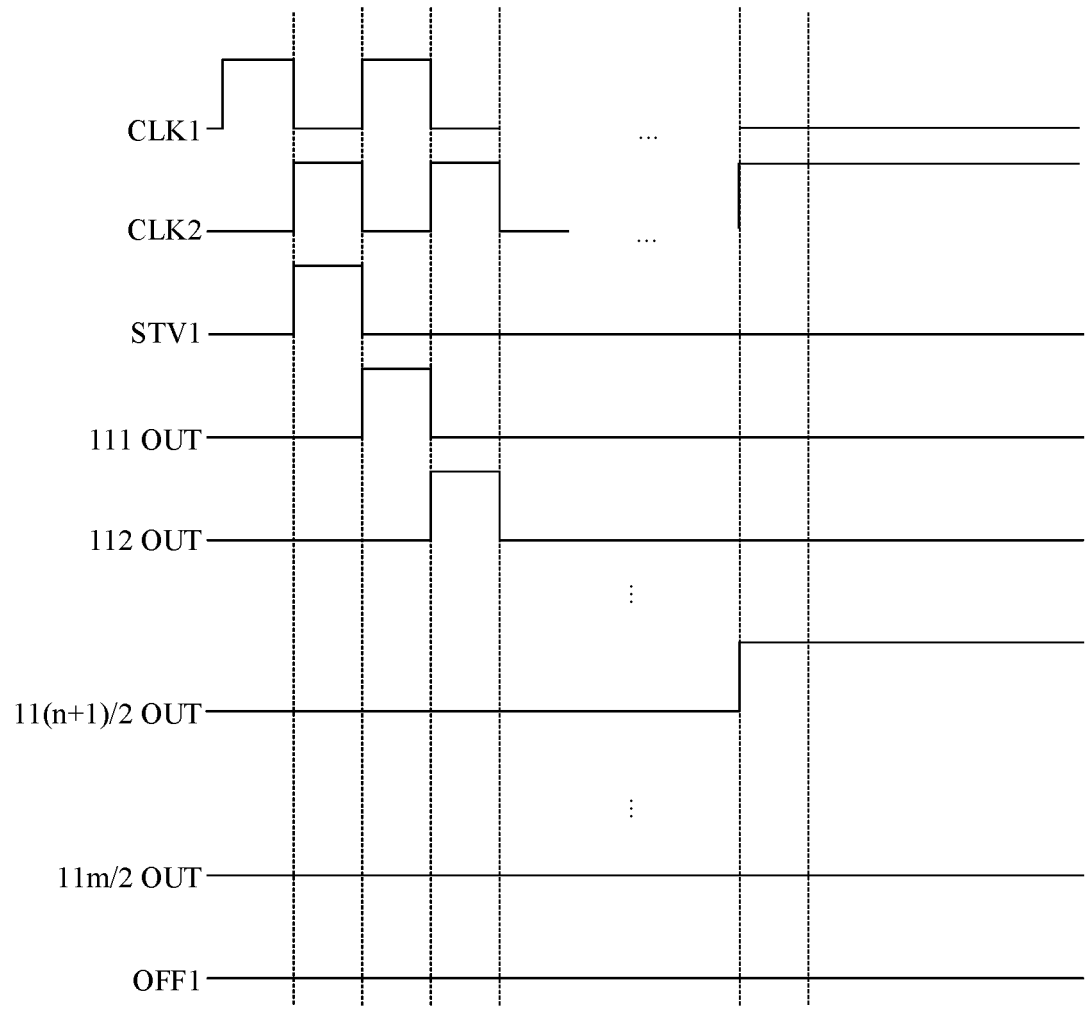
FIG. 11 is a sequence diagram of a signal line repair stage of the display apparatus shown in FIG. 8.

FIG. 11 is a sequence diagram of a signal line repair stage of the display apparatus shown in FIG. 8. Still assuming that the $n^{th}$ first signal line DLn among the m first signal lines DL is disconnected, if n is an odd number, the repair methods shown in FIG. 8 and FIG. 11 differ from those shown in FIG. 7 and FIG. 10 in that the shift output end OUT of the $((n+1)/2)^{th}$-stage first shift unit 11((n+1)/2) continuously outputs an enable signal, and other first shift units 11 are continuously turned off, thereby continuously electrically connecting the $n^{th}$ first signal line DLn to the (n+1)th first signal line DL(n+1), so as to implement repair of the $n^{th}$ first signal line DL. In this embodiment, the $((n+1)/2)^{th}$-stage first shift unit 11n continuously outputs an enable signal to control a corresponding connection switch 12 to be continuously turned on, so that the disconnected $n^{th}$ first signal line DLn is electrically connected to the $(n+1)^{th}$ first signal line DL(n+1).

In the embodiments shown in FIG. 7 and FIG. 8, every two first signal lines DL correspond to one connection switch 12 and one stage of first shift unit 11, which minimizes a quantity of first shift units 11 and makes it easy to implement a narrow frame. In addition, the first shift unit 11 of the stage used for repair is enabled to output an enable signal relatively quickly in the repair process, and efficiency is higher.

Figure 12:
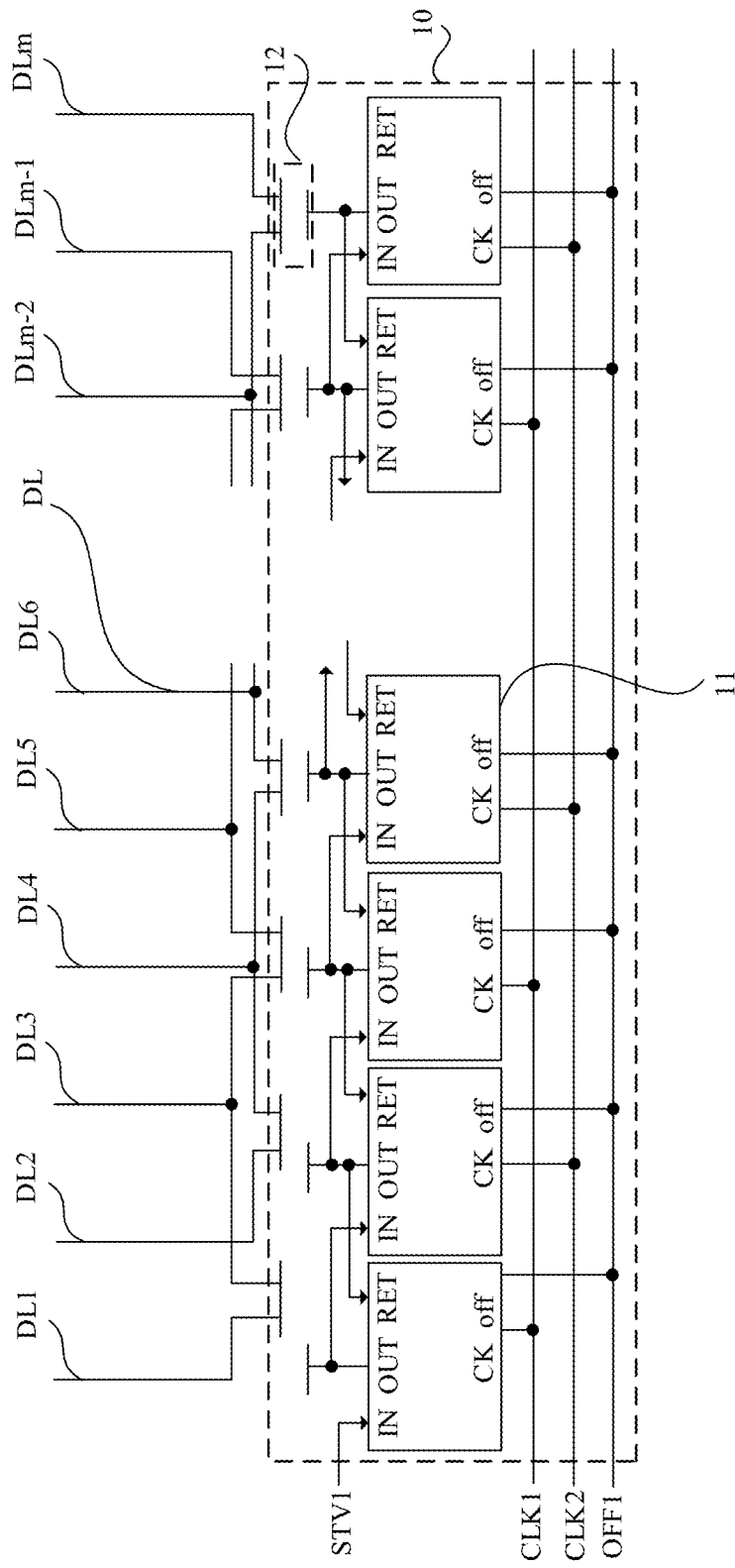
FIG. 12 is a partial enlarged view of yet another display apparatus according to an embodiment of this application.

FIG. 12 is a partial enlarged view of yet another display apparatus according to an embodiment of this application. In another embodiment of this application, as shown in FIG. 12, between two first signal lines DL electrically connected to a same connection switch 12 in a signal line repair module 10, at least one first signal line DL electrically connected to another connection switch 12 is disposed, that is, connection switches 12 connected to two adjacent first signal lines DL among m first signal lines DL electrically connected to the signal line repair module 10 are different. As shown in FIG. 12, one first signal line DL is disposed between first signal lines DL that are electrically connected to an input end and an output end of one connection switch 12 respectively, that is, a first first signal line DL1 and a third first signal line DL3 are electrically connected to an input end and an output end of one connection switch 12 respectively, a second first signal line DL2 and a fourth first signal line DL4 are electrically connected to an input end and an output end of one connection switch 12 respectively, the third first signal lines DL3 and a fifth first signal line DL5 are electrically connected to an input end and an output end of one connection switch 12 respectively, the fourth first signal lines DL4 and a sixth first signal line DL6 are electrically connected to an input end and an output end of one connection switch 12 respectively, . . . , and a $(m-2)^{th}$ first signal lines DL(m−2) and an $m^{th}$ first signal line DLm are electrically connected to an input end and an output end of one connection switch 12 respectively.

In this embodiment, a disconnected first signal line DL may be electrically connected to a spaced first signal line DL by using a connection switch 12 electrically connected to the disconnected first signal line DL, so as to be repaired.

As shown in FIG. 12, in an implementation of this embodiment, among some first signal lines DL, two first signal lines DL electrically connected to one connection switch 12 are spaced, and one first signal line DL is electrically connected to two connection switches 12. In an alternative embodiment of this embodiment, two first signal lines DL electrically connected to one connection switch 12 are spaced, and every two first signal lines DL are electrically connected to one connection switch 12.

As shown in FIG. 1 and FIG. 2, one first signal line DL provides a signal to sub-pixels P0 in a same column. Assuming that a plurality of sub-pixels P0 include first-color sub-pixels P1, second-color sub-pixels P2, and third-color sub-pixels P3, the sub-pixels P0 in the same column are sub-pixels of a same color, and one first signal line DL provides a signal to the sub-pixels in the same column. As shown in FIG. 1 and FIG. 2, sub-pixels in a first column are the first-color sub-pixels P1 to which a signal is provided by one same first signal line DL, sub-pixels in a second column are the second-color sub-pixels P2 to which a signal is provided by one same first signal line DL, and sub-pixels in a third column are the third-color sub-pixels P3 to which a signal is provided by one same first signal line DL.

Figure 13:
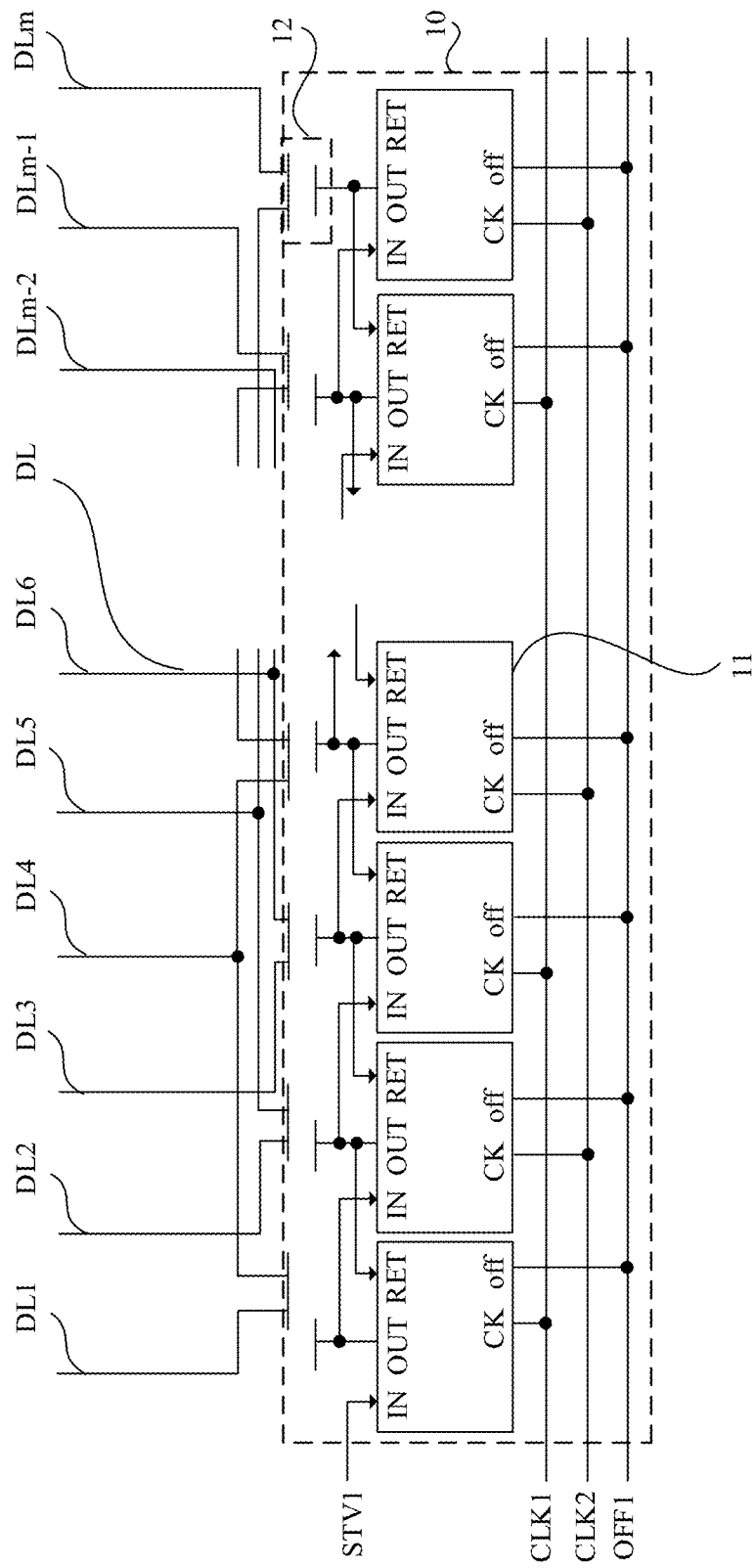
FIG. 13 is a partial enlarged view of still yet another display apparatus according to an embodiment of this application.

In an embodiment of this application, among first signal lines DL that provide signals to sub-pixels of the same color in different columns, each first signal line DL and another first signal line DL are connected to an input end and an output end of one connection switch respectively. FIG. 13 is a partial enlarged view of still yet another display panel according to an embodiment of this application. As shown in FIG. 13, among a plurality of first signal lines DL that provide signals for first-color sub-pixels P1 in different columns, each first signal line DL and another first signal line DL are electrically connected to one connection switch 12; among a plurality of first signal lines DL that provide signals for second-color sub-pixels P2 in different columns, each first signal line DL and another first signal line DL are electrically connected to one connection switch 12; and among a plurality of first signal lines DL that provide signals for third-color sub-pixels P3 in different columns, each first signal line DL and another first signal line DL are electrically connected to one connection switch 12. Then one first signal line DL electrically connected to the input end of each connection switch 12 and one first signal line DL electrically connected to the output end of the connection switch provide signals to sub-pixels of a same light-emitting color located in different columns, respectively.

As shown in FIG. 1 and FIG. 2, two first signal lines DL that provide signals to second-color sub-pixels P2 and third-color sub-pixels P3 respectively are included between two first signal lines DL that provide signals to two adjacent columns of first-color sub-pixels P1, two first signal lines DL that provide signals to first-color sub-pixels P1 and third-color sub-pixels P3 respectively are included between two first signal lines DL that provide signals to two adjacent columns of second-color sub-pixels P2, and two first signal lines DL that provide signals to first-color sub-pixels P1 and second-color sub-pixels P2 respectively are included between two first signal lines DL that provide signals to two adjacent columns of third-color sub-pixels P3. As shown in FIG. 13, a first first signal line DL1 and a fourth first signal line DL4 provide signals to sub-pixels of a same color in different columns, respectively, and then the first first signal line DL1 and the fourth first signal line DL4 are electrically connected to an input end and an output end of one connection switch 12 respectively; a second first signal line DL2 and a fifth first signal line DL5 provide signals to sub-pixels of a same color in different columns, respectively, and then the second first signal line DL2 and the fifth first signal line DL5 are electrically connected to an input end and an output end of one connection switch 12 respectively; and a third first signal line DL3 and a sixth first signal line DL6 provide signals to sub-pixels of a same color in different columns, respectively, and then the third first signal line DL3 and the sixth first signal line DL6 are electrically connected to an input end and an output end of one connection switch 12 respectively. Then, when one first signal line DL is disconnected, the other first signal line DL electrically connected thereto repairs the same and provides a signal. Because the two first signal lines DL provide signals to sub-pixels of a same color, after the disconnected first signal line DL is repaired, a display grayscale of the sub-pixels corresponding thereto is closer to an original grayscale, and an impact on a display effect is smaller.

In an embodiment of this application, as shown in FIG. 1 to FIG. 3, a non-display area BB of the display apparatus is further provided with a signal line defect detection module 20, and the signal line defect detection module 20 is electrically connected to a first signal line DL and configured to detect a defect of the first signal line DL.

The signal line defect detection module 20 includes a detection line DET, a reset line REF, a plurality of switches 22, and a plurality of second shift switches 21, where the plurality of switches 22 include a plurality of detection switches 22a and a plurality of reset switches 22b.

The detection line DET is used to receive signals on first signal lines DL and transmit the signals to a drive chip 30. The drive chip 30 determines whether the signal on a first signal line DL is consistent with a reference signal. If a result is that the signals are inconsistent, it is determined that the first signal line DL is defective. If no signal exists on a first signal line DL, it is determined that the first signal line DL is disconnected.

The reset line REF is used to obtain a reset signal from the drive chip 30 and transmit the reset signal to the detection line DET to reset the signal on the detection line DET.

The plurality of detection switches 22*a* are disposed in a one-to-one correspondence with a plurality of first signal lines DL, an input end of each detection switch 22*a* is electrically connected to one corresponding first signal line DL, and an output end thereof is electrically connected to the detection line DET. When the detection switch 22*a* is turned on, the signal on the first signal line DL electrically connected to the input end of the detection switch may be transmitted to the detection line DET electrically connected to the output end of the detection switch, then the signal on the first signal line DL may be transmitted to a drive chip 3030 or a mainboard 003 by using the detection line DET, and the signal is processed to determine whether the first signal line DL is defective.

An input end of each reset switch 22*b* is electrically connected to the reset line REF, and an output end thereof is electrically connected to the detection line DET. When the reset switch 22*b* is turned on, a reset signal transmitted on the reset line REF electrically connected to the input end of the reset switch is transmitted to the detection line DET, and the signal on the detection line DET is reset.

As shown in FIG. 3, the plurality of second shift units 21 include a plurality of first-type second shift units 21*a* and a plurality of second-type second shift units 21*b*. The plurality of first-type second shift units 21*a* are electrically connected to the plurality of detection switches 22*a* in a one-to-one correspondence, and a signal output by a shift output end OUT of each first-type shift unit 21*a* controls the detection switch 22*a* electrically connected to the first-type shift unit to be turned on or turned off; the plurality of second-type second shift units 21*b* are electrically connected to the plurality of reset switches 22*b* in a one-to-one correspondence, and a signal output by a shift output end OUT of each second-type second shift unit 21*b* controls the reset switch 22*b* electrically connected to the second-type second shift unit to be turned on or turned off.

Because after one detection switch 21*a* is turned on, a signal on the detection line DET is a signal on a first signal line DL electrically connected to the detection switch 21*a*, to ensure detection accuracy of the next first signal line DL, the signal on the detection line DET needs to be reset. Therefore, the reset switches 22*b* and the detection switches 22*a* may be alternately disposed one by one, and the reset switches 22*b* are turned on after the corresponding detection switches 22*a* are turned on and then turned off.

In this embodiment, the second shift units 21 may have the same structure and operating principle as the first shift units 11, and the second-stage shift units 21 may also be cascaded in the same manner as the first shift units 11. A turn-on signal input end IN of a first-stage second shift unit 21 is electrically connected to a start signal line, for example, a second start signal line STV2, and the second start signal line STV2 provides an enable signal to the turn-on signal input end IN of the first-stage second shift unit 21. Clock signal input ends CLK of two stages of adjacent second shift units 21 among the cascaded second shift units 21 are connected to different clock signal lines. As shown in FIG. 3, clock signal input ends CLK of a plurality of stages of cascaded second shift units 21 are alternately electrically connected to a third clock signal line CLK3 and a fourth clock signal line CLK4, and the third clock signal line CLK3 and the fourth clock signal line CLK4 output pulse signals alternately, so that the cascaded second shift units 21 may sequentially output enable signals in cooperation with a signal received by the turn-on signal input end IN.

As shown in FIG. 3, reset signal input ends off of the second shift units 21 included in the signal line defect detection module 200 may be all electrically connected to a same reset signal line, and the reset signal line may continuously receive and transmit, in a signal line defect detection stage, reset signals provided by the drive chip 30. For example, the reset signal input ends are electrically connected to a second reset signal line OFF2, and the second reset signal line OFF2 continuously receives and transmits, in the defect detection stage, reset signals provided by the drive chip 30.

To detect the first signal lines DL sequentially, signals on the first signal lines DL should be sequentially transmitted to the drive chip 3030 or a mainboard 004 by using the detection line DET, and then the first-type second shift units 21*a* should be sequentially turned on, so that the corresponding detection switches 22*a* are sequentially turned on. Correspondingly, the second-type second shift units 21*b* should also be sequentially turned on, so that the corresponding reset switches 22*b* are sequentially turned on.

In an embodiment of this application, the first-type second shift units 21*a* and the second-type second shift units 21*b* are sequentially and alternately disposed and cascaded, that is, the second shift units 21 in the signal line defect detection module 20 are sequentially cascaded, and the second-type second shift units 21*b* are disposed between adjacent first-type second shift units 21*a*. Then, after one first-type second shift unit 21*a* outputs an enable signal, detection of one first signal line DL is completed; then the first-type second shift unit 21*a* is turned off and the second-type second shift unit 21*b* cascaded with and adjacent to the first-type second shift unit 21*a* outputs an enable signal to complete resetting of the detection line DET; then the second-type second shift unit 21*b* is turned off and the first-type second shift unit 21*a* cascaded with and adjacent to the second-type second shift unit 21*b* outputs an enable signal to complete detection of another first signal line DL; . . . ; and this operation is repeated until detection of all the first signal lines DL is completed.

In another embodiment of this application, the first-type second shift units 21*a* are sequentially cascaded and the second-type second shift units 21*b* are sequentially cascaded. Then, after one first-type second shift unit 21*a* outputs an enable signal, detection of one first signal line DL is completed; then the first-type second shift unit 21*a* is turned off and one second-type second shift unit 21*b* outputs an enable signal to complete resetting of the detection line DET; then the first-type second shift unit 21*a* cascaded with and adjacent to the previous first-type second shift unit 21*a* outputs an enable signal to complete detection of one first signal line DL; . . . ; and this operation is repeated until detection of all the first signal lines DL is completed.

In this embodiment of this application, defect detection of the first signal lines DL does not require detection software or a detection device such as a microscope, which can reduce detection costs and improve detection efficiency.

An operating stage of the display panel further includes a signal line defect detection stage. In the signal line defect detection stage, the signal line defect detection module 20 operates and locates a defective first signal line DL. When a first signal line DL with a disconnection defect is detected, the signal line repair module 10 in each foregoing embodiment may be started to complete repair of the disconnected first signal line DL.

Figure 14:
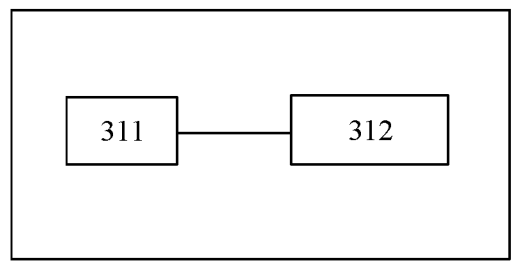
FIG. 14 is a schematic diagram of a structure of a drive chip according to an embodiment of this application.

An embodiment of this application further provide a drive chip, which can be configured to control signal line repair of a display panel according to an embodiment of this application. FIG. 14 is a schematic diagram of a structure of a drive chip according to an embodiment of this application. As shown in FIG. 14, the drive chip includes a control unit 311 and an input/output unit 312.

When the drive chip determines that a disconnected first signal line exists, the control unit 311 instructs the input/output unit 312 to provide a control signal, so that the disconnected first signal line DL is electrically connected to another first signal line DL. Specifically, a control signal is provided to a plurality of cascaded first shift units 11, to control shift output ends of the a plurality of stages of cascaded first shift units 11 to sequentially output enable signals. For example, an enable signal is provided to a start signal line, a reset signal is provided to a reset signal line, pulse signals are provided to a clock signal line, and enable signals or disable signals are continuously output after a plurality of pulse signals are output to the clock signal line.

The control unit 311 is also configured to instruct the input/output unit 312 to continuously output a control signal to a first shift unit 11 corresponding to a connection switch 12 electrically connected to the disconnected first signal line DL, so that the first shift unit 11 continuously outputs an enable signal in the display stage, to control the connection switch 12 electrically connected to the disconnected first signal line DL to be continuously turned on, so that the disconnected first signal line DL is electrically connected to another first signal line DL. For example, enable signals or disable signals are continuously output after a plurality of pulse signals are output to clock signal lines.

The drive chip is further configured to: when it is determined to enter a signal line defect detection stage, determine whether a to-be-detected first signal line DL is disconnected based on a result of comparison between a detection result signal obtained from a detection line DET electrically connected to the drive chip and a test signal sent to the to-be-detected first signal line DL. This specifically includes:

the input/output unit 312 provides a test signal to a first signal line DL, so that the test signal is transmitted on the first signal line DL, and the test signal is used as a reference value for detecting whether the first signal line DL is defective;

the input/output unit 312 receives a signal on the detection line DET, and transmits the received signal on the detection line DET to the control unit 311;

the input/output unit 312 provides a reset signal to the reset line REF, and the reset signal is used to reset the detection line DET during a period when the detection line DET sequentially collects signals on two first signal lines DL;

a signal is output to a plurality of first-type second shift units 21a, so that the first-type second shift units 21a sequentially output enable signals, and therefore the detection line DET sequentially collects signals on different signal lines DL; and a signal is output to a plurality of second-type second shift units 21b, so that the second-type second shift units 21b sequentially output enable signals, and therefore the detection line DET is reset during the period of sequentially collecting the signals on the two first signal lines DL.

The control unit 311 is further configured to compare a signal on the detection line DET with a test signal after receiving the signal that is on the detection line DET and that is transmitted by the input/output unit 312, and determine that a first signal line DL corresponding to the signal is defective when the signal on the detection line DET is different from the test signal.

The control unit 311 instructs the input/output unit 312 to output corresponding signals in the signal line repair stage and the display stage based on the position of the defective first signal line DL.

The drive chip further provides a signal to a plurality of first signal lines DL to control sub-pixels P0 to perform light-emitting display.

Referring to the foregoing illustration of FIG. 1 or FIG. 2, the drive chip in FIG. 1 or FIG. 2 is the drive chip 30 according to this embodiment of FIG. 14 of this application.

Figure 15:
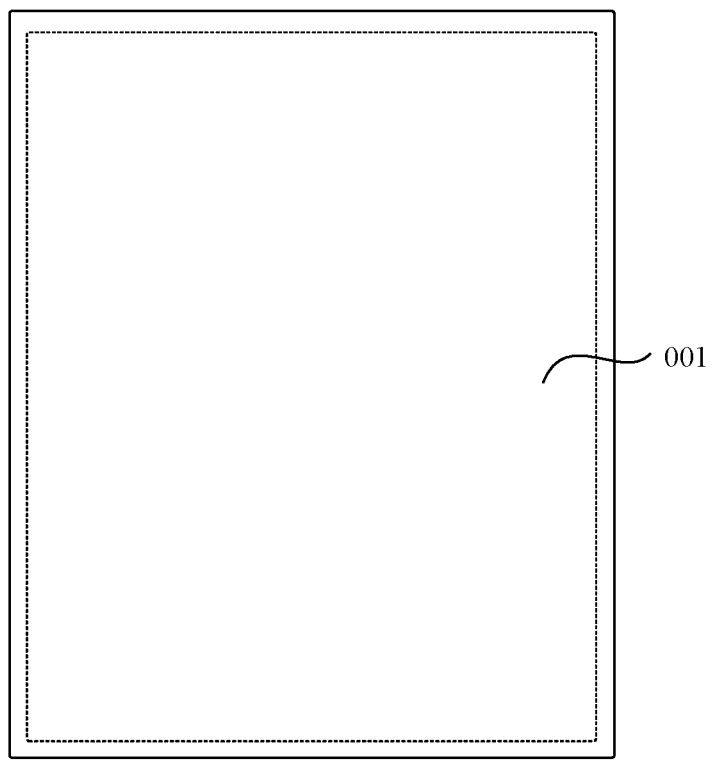
FIG. 15 is a schematic diagram of an electronic device according to an embodiment of this application.

This application further provides an electronic device. FIG. 15 is a schematic diagram of an electronic device according to an embodiment of this application. As shown in FIG. 15, the electronic device includes the display apparatus according to any one of the embodiments of this application. The specific structure of the display apparatus has been described in detail in the foregoing embodiments. Details are not described herein again. Certainly, the electronic device shown in FIG. 15 is provided only for schematic illustration, and may be, for example, any electronic device with a display function, such as a mobile phone, a tablet computer, a notebook computer, an E-book reader, a TV, or a smartwatch.

The foregoing descriptions are merely specific implementations of this application. Any person skilled in the art can easily conceive modifications or replacements within the technical scope of this application, and these modifications or replacements shall fall within the protection scope of this application. The protection scope of this application shall be subject to the protection scope of the claims.

What is claimed is:

1. A display apparatus, comprising:
   a plurality of sub-pixels, wherein the sub-pixels are used for light-emitting display;
   a plurality of signal lines, wherein the plurality of signal lines are electrically connected to the plurality of sub-pixels, respectively, and the plurality of signal lines provide signals for light-emitting display to the plurality of sub-pixels;
   a signal line repair circuit, wherein the signal line repair circuit is electrically connected to the plurality of signal lines, and configured to repair a disconnected signal line; and
   a non-display area that includes a signal line defect detection circuit;
   wherein the signal line repair circuit comprises:
      a plurality of connection switches, wherein an input end of each connection switch is electrically connected to one signal line, and an output end thereof is electrically connected to another signal line;
      a plurality of first shift circuits, wherein the plurality of first shift circuits are sequentially cascaded, and the plurality of first shift circuits are disposed in a one-to-one correspondence with the plurality of connection switches, wherein a shift output end of each first shift unit is electrically connected to a control end of a corresponding connection switch; and
      a drive chip, wherein the drive chip is electrically connected to the plurality of signal lines and the signal line repair circuit, and is configured to:

provide the signal for controlling the light-emitting display of the sub-pixels to the signal lines, send, in response to determining that a disconnected signal line exists, a control signal to the signal line repair circuit to enable shift output ends of the plurality of first shift circuits to sequentially output enable signals, and enable the first shift circuit corresponding to a connection switch electrically connected to the disconnected signal line to continuously output enable signals, to control the connection switch electrically connected to the disconnected signal line to be continuously turned on, so that the disconnected signal line is electrically connected to another signal line;

wherein the signal line defect detection circuit is electrically connected to the signal lines and configured to detect a defect of the signal lines, and the signal line defect detection circuit comprises:

a detection line, configured to transmit signals on the signal lines to the drive chip;

a reset line, configured to obtain a reset signal from the drive chip and transmit the reset signal to the detection line;

a plurality of detection switches, wherein the plurality of detection switches are disposed in a one-to-one correspondence with the plurality of signal lines, an input end of each detection switch is electrically connected to one signal line, an output end thereof is electrically connected to the detection line, and in response to the detection switch being turned on, a signal on the signal line electrically connected to the input end of the detection switch is transmitted to the detection line electrically connected to the output end of the detection switch; and reset switches, wherein an input end of each reset switch is electrically connected to the repair line, and an output end thereof is electrically connected to the detection line, and wherein in response to the reset switch being turned on, a reset signal transmitted on the reset line electrically connected to the input end of the reset switch is transmitted to the detection line.

2. The display apparatus according to claim 1, wherein any two adjacent signal lines among the plurality of signal lines electrically connected to the signal line repair circuit are electrically connected to the input end and the output end of a same connection switch, respectively.

3. The display apparatus according to claim 1, wherein every two adjacent signal lines among the plurality of signal lines electrically connected to the signal line repair circuit are electrically connected to the input end and the output end of a same connection switch, respectively.

4. The display apparatus according to claim 1, wherein at least one signal line electrically connected to another connection switch is comprised between two signal lines electrically connected to a same connection switch.

5. The display apparatus according to claim 4, wherein the plurality of sub-pixels comprises at least sub-pixels with three light-emitting colors, sub-pixels in a same column have a same light-emitting color, and one signal line provides a signal to the sub-pixels in the same column; and wherein one signal line electrically connected to the input end of each connection switch and one signal line electrically connected to the output end of the connection switch provide signals to sub-pixels of a same light-emitting color located in different columns, respectively.

6. The display apparatus according to claim 1, wherein the signal line defect detection circuit comprises a plurality of reset switches, the detection switches and the reset switches are alternately disposed in a one-to-one correspondence, and the reset switches are turned on after the corresponding detection switches are turned on and then turned off.

7. The display apparatus according to claim 6, wherein the signal line defect detection circuit further comprises a plurality of second shift circuits, and the plurality of second shift circuits comprises a plurality of first-type second shift circuits and a plurality of second-type second shift circuits;

wherein the first-type second shift circuits are electrically connected to the detection switches in a one-to-one correspondence, and signals output by shift output ends of the first-type second shift circuits control the detection switches electrically connected thereto to be turned on or turned off; and wherein the second-type second shift circuits are electrically connected to the reset switches in a one-to-one correspondence, and signals output by shift output ends of the second-type second shift circuits control the reset switches electrically connected thereto to be turned on or turned off.

8. The display apparatus according to claim 7, wherein the first-type second shift circuits and the second-type second shift circuits are sequentially and alternately disposed and cascaded.

9. The display apparatus according to claim 7, wherein the plurality of first-type second shift circuits are sequentially cascaded, and the second-type second shift circuits are sequentially cascaded.

10. An electronic device, comprising:

a display apparatus, comprising:

a plurality of sub-pixels, wherein the sub-pixels are used for light-emitting display;

a plurality of signal lines, wherein the plurality of signal lines are electrically connected to the plurality of sub-pixels, respectively, and the plurality of signal lines provide signals for light-emitting display to the plurality of sub-pixels;

a signal line repair circuit, wherein the signal line repair circuit is electrically connected to the plurality of signal lines, and configured to repair a disconnected signal line; and a non-display area that includes a signal line defect detection circuit;

wherein the signal line repair circuit comprises:

a plurality of connection switches, wherein an input end of each connection switch is electrically connected to one signal line, and an output end thereof is electrically connected to another signal line;

a plurality of first shift circuits, wherein the plurality of first shift circuits are sequentially cascaded, and the plurality of first shift circuits are disposed in a one-to-one correspondence with the plurality of connection switches, wherein a shift output end of each first shift unit is electrically connected to a control end of a corresponding connection switch; and a drive chip, wherein the drive chip is electrically connected to the plurality of signal lines and the signal line repair circuit, and is configured to:

provide the signal for controlling the light-emitting display of the sub-pixels to the signal lines, send, in response to determining that a disconnected signal line exists, a control signal to the signal line repair circuit to enable shift output ends of the plurality of first shift circuits to sequentially output enable signals, and enable the first shift circuit corresponding to a connection switch electrically connected to the disconnected signal line to continuously output enable signals, to control the connection switch electrically connected to the disconnected signal line to be continuously turned on, so that the disconnected signal line is electrically connected to another signal line; and wherein the signal line defect detection circuit is electrically connected to the signal lines and configured to detect a defect of the signal lines, and the signal line defect detection circuit comprises:

a detection line, configured to transmit signals on the signal lines to the drive chip;

a reset line, configured to obtain a reset signal from the drive chip and transmit the reset signal to the detection line;

a plurality of detection switches, wherein the plurality of detection switches are disposed in a one-to-one correspondence with the plurality of signal lines, an input end of each detection switch is electrically connected to one signal line, an output end thereof is electrically connected to the detection line, and in response to the detection switch being turned on, a signal on the signal line electrically connected to the input end of the detection switch is transmitted to the detection line electrically connected to the output end of the detection switch; and reset switches, wherein an input end of each reset switch is electrically connected to the repair line, and an output end thereof is electrically connected to the detection line, and wherein in response to the reset switch being turned on, a reset signal transmitted on the reset line electrically connected to the input end of the reset switch is transmitted to the detection line.

11. The electronic device according to claim 10, wherein any two adjacent signal lines among the plurality of signal lines electrically connected to the signal line repair circuit are electrically connected to the input end and the output end of a same connection switch, respectively.

12. The electronic device according to claim 10, wherein every two adjacent signal lines among the plurality of signal lines electrically connected to the signal line repair circuit are electrically connected to the input end and the output end of a same connection switch, respectively.

13. The electronic device according to claim 10, wherein at least one signal line electrically connected to another connection switch is comprised between two signal lines electrically connected to a same connection switch.

14. The electronic device according to claim 13,
wherein the plurality of sub-pixels comprises at least sub-pixels with three light-emitting colors, sub-pixels in a same column have a same light-emitting color, and one signal line provides a signal to the sub-pixels in the same column; and wherein one signal line electrically connected to the input end of each connection switch and one signal line electrically connected to the output end of the connection switch provide signals to sub-pixels of a same light-emitting color located in different columns, respectively.

15. The electronic device according to claim 10, wherein the signal line defect detection circuit comprises a plurality of reset switches, the detection switches and the reset switches are alternately disposed in a one-to-one correspondence, and the reset switches are turned on after the corresponding detection switches are turned on and then turned off.

16. The electronic device according to claim 15,
wherein the signal line defect detection circuit further comprises a plurality of second shift circuits, and the plurality of second shift circuits comprises a plurality of first-type second shift circuits and a plurality of second-type second shift circuits;

wherein the first-type second shift circuits are electrically connected to the detection switches in a one-to-one correspondence, and signals output by shift output ends of the first-type second shift circuits control the detection switches electrically connected thereto to be turned on or turned off; and wherein the second-type second shift circuits are electrically connected to the reset switches in a one-to-one correspondence, and signals output by shift output ends of the second-type second shift circuits control the reset switches electrically connected thereto to be turned on or turned off.

17. The electronic device according to claim 16, wherein the first-type second shift circuits and the second-type second shift circuits are sequentially and alternately disposed and cascaded.

18. The electronic device according to claim 16, wherein the plurality of first-type second shift circuits are sequentially cascaded, and the second-type second shift circuits are sequentially cascaded.

* * * * *

UNITED STATES PATENT AND TRADEMARK OFFICE
CERTIFICATE OF CORRECTION

| | |
|---|---|
| PATENT NO. | : 11,928,996 B2 |
| APPLICATION NO. | : 17/793520 |
| DATED | : March 12, 2024 |
| INVENTOR(S) | : Chen et al. |

It is certified that error appears in the above-identified patent and that said Letters Patent is hereby corrected as shown below:

On the Title Page

Column 1, Applicant (71): "Honor Device Co., Ltd., Guangdong (CN)" should read -- Honor Device Co., Ltd., Shenzhen (CN) --.

Signed and Sealed this
Sixteenth Day of April, 2024

Katherine Kelly Vidal
*Director of the United States Patent and Trademark Office*